US 6,646,909 B2

(12) United States Patent
Miwa et al.

(10) Patent No.: US 6,646,909 B2
(45) Date of Patent: Nov. 11, 2003

(54) MEMORY CELL, NONVOLATILE MEMORY DEVICE AND CONTROL METHOD THEREFOR IMPROVING RELIABILITY UNDER LOW POWER SUPPLY VOLTAGE

(75) Inventors: Tohru Miwa, Tokyo (JP); Hideo Toyoshima, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 51 days.

(21) Appl. No.: 10/084,339

(22) Filed: Feb. 28, 2002

(65) Prior Publication Data

US 2002/0126522 A1 Sep. 12, 2002

(30) Foreign Application Priority Data

Mar. 7, 2001 (JP) ........................................ 2001-063812

(51) Int. Cl.[7] .............................................. G11C 11/22
(52) U.S. Cl. ...................... 365/154; 365/171; 365/145
(58) Field of Search ................................ 365/154, 171, 365/145, 148, 163, 156

(56) References Cited

U.S. PATENT DOCUMENTS

| 4,651,303 | A | * | 3/1987 | Dias et al. ............. 365/185.08 |
| 4,809,225 | A | | 2/1989 | Dimmler et al. ............ 365/145 |
| 4,918,654 | A | * | 4/1990 | Eaton et al. ................ 365/145 |
| 5,978,252 | A | | 11/1999 | Miwa |
| 6,285,575 | B1 | | 9/2001 | Miwa ......................... 365/145 |

FOREIGN PATENT DOCUMENTS

| JP | 9-17965 | 1/1997 |
| JP | 2674775 | 7/1997 |
| JP | 2693967 | 9/1997 |
| JP | 2000-293989 | 10/2000 |

* cited by examiner

Primary Examiner—Vu A. Le
(74) Attorney, Agent, or Firm—Foley & Lardner

(57) ABSTRACT

For a memory cell comprising: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes, storing operation of the memory cell is carried out by swinging the voltage of the plate line between a first voltage that is higher than power supply voltage of the memory cell and a second voltage that is lower than the ground potential while keeping the switching elements in off states, thereby remanent polarization of the ferroelectric capacitors is made larger. In addition, recall operation of the memory cell is carried out by driving the plate line to a third voltage that is higher than the power supply voltage or a fourth voltage that is lower than the ground potential so as to enlarge operation margin. By such storing operation and recall operation, the reliability of nonvolatile memory under a low power supply voltage can be improved.

56 Claims, 17 Drawing Sheets (6-TRANSISTOR CMOS TYPE)

F I G. 14
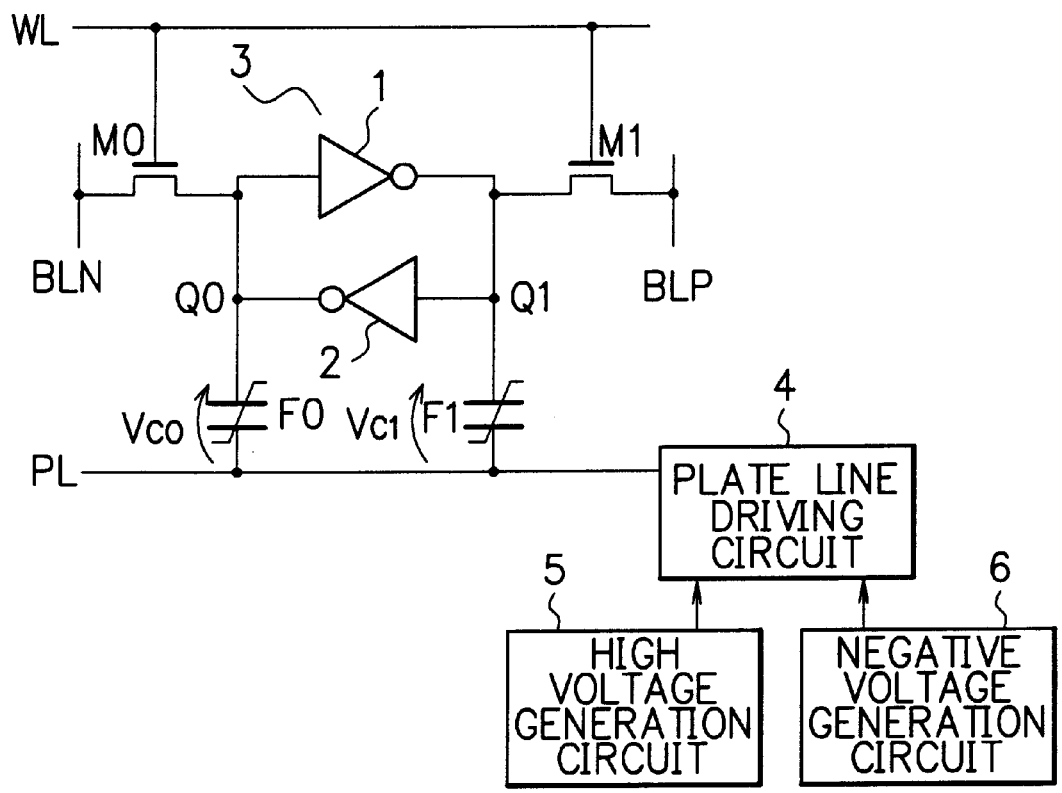

(HIGH-RESISTANCE-LOAD 4-TRANSISTOR TYPE)

(LOADLESS 4-TRANSISTOR TYPE)

MEMORY CELL, NONVOLATILE MEMORY DEVICE AND CONTROL METHOD THEREFOR IMPROVING RELIABILITY UNDER LOW POWER SUPPLY VOLTAGE

BACKGROUND OF THE INVENTION

The present invention relates to a memory cell of shadow RAM (Random Access Memory) employing ferroelectric capacitors, a nonvolatile memory device employing the memory cells, and a control method for the memory cell, and in particular, to shadow RAM, in which high-speed reading/writing from/to SRAM cells is realized when power is supplied thereto and nonvolatile memory by use of ferroelectric capacitors is realized when power is not supplied thereto, that is capable of operating with high reliability even when the power supply voltage is low.

DESCRIPTION OF THE RELATED ART

A variety of shadow RAMs in which ferroelectric capacitors and SRAM cells are combined have been proposed so far. When power is being supplied, the shadow RAM stores information in its SRAM cells, offering high-speed reading/writing capability of the level of ordinary SRAM. Further, the shadow RAM realizes nonvolatile memory when power is not supplied thereto, by transferring data which has been stored in the SRAM cells to ferroelectric capacitors (as polarization directions of the ferroelectric capacitors) before the power is shut off (storing operation). In short, the shadow RAM employing ferroelectric capacitors is a storage device having two advantages: nonvolatility of ferroelectric memory and high-speed operation of SRAM.

FIG. 1 is a circuit diagram showing the composition of a memory cell of shadow RAM employing ferroelectric capacitors which has been disclosed in Japanese Patent Application Laid-Open No.2000-293989. In the memory cell of FIG. 1, a flip-flop 3 is formed by connecting two inverters 1 and 2 in ring connection (the input/output terminal of an inverter is connected to the output/input terminal of the other inverter). Two memory nodes Q0 and Q1 of the flip-flop 3 are connected to a negative bit line BLN and a positive bit line BLP respectively via NMOS transistors MO and M1 which function as transfer gates. The positive/negative bit lines BLP and BLN are used as a pair, and a sense amplifier (unshown) for comparing the voltages of the positive/negative bit lines BLP and BLN are connected to the bit lines.

To the bit lines BLP and BLN, a writing circuit (unshown) for connecting selected bit lines to the ground potential when data writing is carried out and a precharge circuit (unshown) for precharging the bit lines to a power supply voltage or the ground potential are also connected. The gates of the NMOS transistors MO and M1 are connected to a common word line WL. The word lines WL are connected to a decoder circuit (unshown). The decoder circuit selectively drives a word line as the target of access according to an address signal. Ferroelectric capacitors F0 and F1, whose lower terminals shown in FIG. 1 are connected to a common plate line PL, are connected to the memory nodes Q0 and Q1 respectively. The plate lines PL are connected to a plate line driving circuit 4. When the power is supplied to the shadow RAM, the plate line driving circuit 4 holds the voltages of the plate lines PL at Vcc/2 except in the storing operation and the recall operation of the shadow RAM.

In the following, the operation of the conventional shadow RAM employing ferroelectric capacitors will be explained in detail. Needless to say, data reading/writing from/to the flip-flops 3 of the shadow RAM are carried out in the same way as in general conventional SRAM. In idle states of the shadow RAM (in which no reading/writing is carried out), data stored in the flip-flops 3 is maintained and preserved by discharging (dropping the voltages of) all the word lines WL, precharging the bit lines to a proper voltage, and stopping the writing circuit.

When data is written into a flip-flop 3, the address decoder circuit drives (raises the voltage of a proper word line WL corresponding to the flip-flop 3, and simultaneously, the writing circuit sets one of the positive/negative bit lines BLP and BLN (corresponding to the flip-flop 3) to a low level depending on the data to be written into the flip-flop 3. By the increase of the voltage of the driven word line WL, the MOS transistors MO and M1 turn on. Since the driving power of the writing circuit is far larger than that of the inverters 1 and 2, the voltage of a memory node (Q0 or Q1) that is connected to the bit line (that is set to the low level by the writing circuit) via a MOS transistor is dropped to the ground potential. At the same time, the voltage of the other memory node (Q1 or Q0) is raised to the power supply voltage and thereby the flip-flop 3 is stabilized.

Data readout from a flip-flop 3 is carried out by precharging the bit line pair (BLP and BLN) corresponding to the flip-flop 3 to a high level, selecting and driving a proper word line corresponding to the flip-flop 3, and amplifying a voltage difference occurring between the bit line pair by use of a sense amplifier. When the voltage of the word line WL is raised, a MOS transistor (M0 or M1) that connects the low-level memory node (Q0 or Q1) and the bit line (BLN or BLP) turns on and thereby the voltage of the bit line (BLN or BLP) starts falling. The other bit line (BLP or BLN) keeps its high level since the MOS transistor (M1 or M0) does not turn on. By detecting the voltage difference between the bit line pair by use of the sense amplifier, data stored in the flip-flop 3 can be read out.

In the following, the storing operation of the shadow RAM memory cell of FIG. 1 will be explained referring to FIGS. 2 and 17. FIG. 17 shows the hysteresis characteristics of the ferroelectric capacitors F0 and F1 on a Q-V plane. FIG. 2 is a timing chart showing the change of voltage of each part of the memory cell of FIG. 1 during the storing operation. When the power is shut off, data which has been stored in the flip-flop 3 is transferred to the ferroelectric capacitors F0 and F1 and stored as polarization directions of the ferroelectric capacitors. The operation is called "storing". The storing is activated by a trigger such as a drop of the power supply voltage or a storing signal which is supplied before the power is shut off. The storing is carried out as follows.

The voltage of the plate line PL when the storing operation is started is Vcc/2. Therefore, depending on the data stored in the flip-flop 3, a voltage −Vcc/2 is applied to a ferroelectric capacitor that is connected to a memory node holding 0V, whereas a voltage Vcc/2 is applied to a ferroelectric capacitor that is connected to a memory node holding the power supply voltage (Vcc).

Incidentally, the aforementioned "voltage" that is applied to each ferroelectric capacitor (F0, F1) is defined as a voltage difference between the upper terminal shown in FIG. 1 (which is connected to the memory node Q0 or Q1) and the lower terminal (which is connected to the plate line PL), that is, the voltage of the upper terminal relative to the lower terminal.

Subsequently, the voltage of the plate line PL is raised to Vcc. By the increase of the plate line voltage, the terminals of the latter ferroelectric capacitor (to which the voltage Vcc/2 has been applied) will have the same voltage Vcc, thereby the voltage that is applied to the ferroelectric capacitor changes to 0V. To the other ferroelectric capacitor, a voltage −Vcc is applied, and thereby the status of the ferroelectric capacitor gets to a point C in the hysteresis loop of FIG. 17.

Subsequently, the voltage of the plate line PL is dropped to 0V, thereby a voltage Vcc is applied to the ferroelectric capacitor that is connected to the memory node holding Vcc and thereby the status of the ferroelectric capacitor gets to a point A in the hysteresis loop of FIG. 17. At the same time, the ferroelectric capacitor that has been at the point C moves to a point D and holds negative remanent polarization.

Finally, the power is shut off. After the power shutoff, the voltage of each memory node converges on the ground potential. Consequently, the ferroelectric capacitor that has been at the point A moves to a point B and holds positive remanent polarization. The remanent polarization of the ferroelectric capacitor endures more than ten years when no voltage is applied thereto, thereby nonvolatile memory is realized in the conventional shadow RAM employing ferroelectric capacitors.

In the following, the recall operation of the shadow RAM memory cell of FIG. 1 will be explained referring to FIG. 3. FIG. 3 is a timing chart showing the change of voltage of each part of the memory cell of FIG. 1 during the recall operation. When the power is turned on, the data which has been stored in the ferroelectric capacitors is transferred to the flip-flop 3. The operation is called "recall". When the power is turned on, the data which has been memorized as the remanent polarization of the ferroelectric capacitors can be recalled to the flip-flop 3, only by supplying power to the flip-flop 3 while maintaining the word line WL and the plate line PL at the low level. As the supply voltage to the flip-flop 3 increases, the voltages of the memory nodes also increase due to the coupling of MOS transistors of the inverters 1 and 2, thereby the voltages applied to the ferroelectric capacitors increase from 0V.

The ferroelectric capacitor holding the positive remanent polarization at the point B of FIG. 17 functions as a smaller capacitance than the ferroelectric capacitor holding the negative remanent polarization at the point D. That is evident from the gentler slope of the path from the point B to the point A on the Q-V plane (shown by an arrow Y1) in comparison with the slope of the path from the point D to the point A (shown by an arrow Y2). Therefore, one of the memory nodes to which the former ferroelectric capacitor (smaller capacitance) is connected raises its voltage faster than the other memory node.

The supply voltage of the flip-flop 3 keeps on increasing, and when the voltage of one of the memory nodes exceeds the threshold voltage of transistors of the inverters 1 and 2, positive feedback is applied to the flip-flop 3 and thereby the voltage difference between the memory nodes is enhanced or amplified. Consequently, the voltage of the memory node corresponding to (that is connected to) the ferroelectric capacitor that stayed at the point B becomes Vcc, whereas the voltage of the other memory node corresponding to the ferroelectric capacitor that stayed at the point D becomes GND. Finally, the voltage of the plate line PL is set to Vcc/2 and the idle state is started. Consequently, the ferroelectric capacitor that had been holding the voltage Vcc before the power shutoff thereafter holds its data at the point B, and holds the voltage Vcc again after the power is turned on again. Similarly, the ferroelectric capacitor that had been holding 0V before the power shutoff thereafter holds its data at the point D, and holds 0V also after the power is turned on again.

As explained above, in the conventional shadow RAM employing ferroelectric capacitors, the data stored in the flip-flop 3 is maintained and preserved after the power shutoff and power on and thereby nonvolatile memory is realized. In addition, data reading/writing can be carried out in the same way as ordinary SRAM since the flip-flop 3 and the MOS transistors M0 and M1 operate similarly to an ordinary SRAM cell.

In some known nonvolatile memories employing ferroelectric capacitors, memory cells like those disclosed in Japanese Patent No.2674775 are employed and each memory cell is composed of a combination of a transistor and a ferroelectric capacitor or a combination of two transistors and two ferroelectric capacitors. In nonvolatile memory of such type, data is memorized as the polarization direction of the ferroelectric capacitor (or as the polarization directions of the ferroelectric capacitors) regardless of whether the power is being supplied or not. Further, data readout in such nonvolatile memory is destructive readout, and thus data has to be written again after the readout. Access to each ferroelectric capacitor becomes very frequent due to the repetitive data writing, therefore, enough device reliability after long-term use can hardly be guaranteed by the present manufacturing technology. On the other hand, in the shadow RAM employing ferroelectric capacitors, access to the ferroelectric capacitor occurs only in the storing operation and the recall operation, therefore, enough product reliability can be ensured even if the quality of the ferroelectric capacitors is relatively low.

FIG. 4 is a circuit diagram showing the composition of a conventional semiconductor memory of Japanese Patent Application Laid-Open No. HEI9-17965, in which RAM having the nonvolatile memory function is disclosed. The memory cell MC of FIG. 4 is composed of transfer MISFETs $Qt_1$ and $QT_2$, an SRAM memory cell that is composed of a flip-flop circuit, and ferroelectric capacitors $Cf_1$ and $Cf_2$. As shown in FIG. 4, the flip-flop circuit of the memory cell MC is composed of two N-channel MISFETs (driving MISFETs) $Qd_1$ and $Qd_2$ and two P-channel MISFETs (load MISFETs) $Qp_1$ and $Qp_2$.

The transfer MISFET $Qt_1$ connects a memory node $N_1$ of the flip-flop circuit to a data line $DL_1$, and the other transfer MISFET $Qt_2$ connects another memory node $N_2$ of the flip-flop circuit to another data line $DL_2$. The gates of the transfer MISFETs $Qt_1$ and $QT_2$ are connected to a word line WL.

Each memory node ($N_1$, $N_2$) is connected to an electrode of a corresponding ferroelectric capacitor ($Cf_1$, $Cf_2$), and the other electrodes of the ferroelectric capacitors $Cf_1$ and $Cf_2$ are electrically connected together at a node $N_3$. To the node $N_3$, a plate voltage ($V_P$) is applied.

In the following, data readout from the flip-flop circuit to the ferroelectric capacitors $Cf_1$ and $Cf_2$ will be explained referring to FIGS. 5 and 6. Incidentally, FIG. 7 shows the change of the supply voltage $V_L$ of the flip flop circuit and the plate voltage $V_P$ and FIG. 8 shows the change of the voltages of the memory nodes $N_1$ and $N_2$.

If data stored in the flip-flop circuit has to be transferred to the ferroelectric capacitors $Cf_1$ and $Cf_2$ at a time $t_1$, the supply voltage $V_L$ of the flip-flop circuit is increased from Vcc to Vcc' as shown in FIG. 5 and FIG. 7 while maintaining the plate voltage $V_P$ at Vss (low level). Incidentally, in this explanation, the data which has been stored in the flip-flop circuit at the time $t_1$ is assumed to be: (memory node $N_1$, memory node $N_2$)=(high level, low level)=(Vcc', Vss).

The voltage Vcc' is assumed to be a high voltage enough to reverse the polarization of the ferroelectric capacitors $Cf_1$ and $Cf_2$. Since the node $N_3$ is at the low level (Vss), by the voltage increase of the memory node $N_1$, a positive-polarization state is written into the ferroelectric capacitor $Cf_1$ which is connected to the memory node $N_1$ as shown in FIG. 5.

Next, data transfer has to be done to the ferroelectric capacitor $Cf_2$ which is connected to the memory node $N_2$. At a time $T_2$, the plate voltage is increased from Vss to Vcc' and thereby the node $N_3$ is raised to the high level (Vcc') while maintaining the supply voltage of the flip-flop circuit at Vcc'. Since the memory node $N_2$ is at the low level (Vss), a negative-polarization state is written into the ferroelectric capacitor $Cf_2$ which is connected to the memory node $N_2$ as shown in FIG. 6.

Even if all the voltages became 0V at a time $t_3$ and thereby the data of the memory nodes $N_1$ and $N_2$ disappeared, the polarization of the ferroelectric capacitors $Cf_1$ and $Cf_2$ remains, therefore, the data of the flip-flop circuit can be maintained and preserved in the ferroelectric capacitors $Cf_1$ and $Cf_2$.

Next, data writing from the ferroelectric capacitors $Cf_1$ and $Cf_2$ to the flip-flop circuit will be explained referring to FIGS. 9 through 13.

If data stored in the ferroelectric capacitors $Cf_1$ and $Cf_2$ has to be transferred to the flip-flop circuit at a time $t_4$, the plate voltage $V_P$ is increased from Vcc to Vcc' while maintaining the supply voltage of the flip-flop circuit at Vss. Since the supply voltage is set to Vss, the load MISFETs $Qp_1$ and $Qp_2$ remain in off states.

However, at the time $t_4$, current passes from the load MISFET $Qp_1$ and the driving MISFET $Qd_1$ to the memory node $N_1$ and thereby the voltage of the memory node $N_1$ rises to $V_{N1}$ instantaneously. The voltage level $V_{N1}$ is determined by the capacitances of the ferroelectric capacitors $Cf_1$ and $Cf_2$ and the parasitic capacitances of the load MISFETs $Qp_1$ and $Qp_2$ and the driving MISFETs $Qd_1$ and $Qd_2$.

When the voltages of the memory nodes $N_1$ and $N_2$ rise into $V_{N1}$ and the voltage level $V_{N1}$ exceeds the threshold voltage of the driving MISFETs $Qd_1$ and $Qd_2$, the driving MISFETs $Qd_1$ and $Qd_2$ turn on, thereby current passes from the memory node $N_1$ to the driving MISFET $Qd_1$ and thereby the voltage of the memory node $N_1$ drops to almost 0V. Similarly, current passes from the memory node $N_2$ to the driving MISFET $Qd_2$ and thereby the voltage of the memory node $N_2$ drops to almost 0V Consequently, the state of the ferroelectric capacitor $Cf_1$, which has been in the positive-polarization state at the time $t_4$, is changed to the negative-polarization state. Incidentally, the ferroelectric capacitor $Cf_2$, which has been in the negative-polarization state at the time $t_4$, remains in the negative-polarization state.

When the polarization of the ferroelectric capacitor $Cf_1$ reverses, a polarization reversal current passes and thereby the voltage of the memory node $N_1$ ($V_{N2}$) gets higher than that of the memory node $N_2$ ($V_{N3}$), that is, a voltage difference occurs between the memory nodes $N_1$ and $N_2$. In such a state, if the supply voltage of the flip-flop circuit is raised to Vcc' at a time $t_6$, a positive feedback is applied to the flip-flop circuit, thereby the memory nodes $N_1$ and $N_2$ are set to the high level (Vcc') and the low level (Vss), respectively.

Subsequently, the plate voltage is dropped to Vss at a time $t_7$ and thereby the state of the ferroelectric capacitor $Cf_1$, which has been in the negative-polarization state at the time $t_6$, is changed to the positive-polarization state. Thereafter, the supply voltage of the flip-flop circuit is dropped to Vcc at a time $t_8$, thereby the voltage of the memory node $N_1$ is changed from Vcc' to Vcc and thereby the flip-flop circuit returns to its normal operation state.

The normal operation of the flip-flop circuit, the data readout from the flip-flop circuit to the ferroelectric capacitors $Cf_1$ and $Cf_2$, and the data writing from the ferroelectric capacitors $Cf_1$ and $Cf_2$ to the flip-flop circuit are carried out as explained above.

However, the conventional shadow RAM and semiconductor memory employing ferroelectric capacitors which have been explained above involves the following problems or drawbacks.

In the conventional shadow RAM employing ferroelectric capacitors, the plate line voltage is changed between the ground potential and the power supply voltage (Vcc) in the storing operation, thereby voltages (Vcc or −Vcc) according to data to be stored are applied to the ferroelectric capacitors and thereby positive/negative remanent polarization is caused. The power supply voltage (Vcc) has to be applied to the ferroelectric capacitor for realizing the nonvolatile memory in the conventional shadow RAM, therefore, if the power supply voltage (Vcc) decreased due to the miniaturization of the integrated circuit, the application of enough voltage to the ferroelectric capacitor becomes difficult and thereby the reliability of the nonvolatile memory data is necessitated to be deteriorated.

Meanwhile, in the conventional semiconductor memory of Japanese Patent Application Laid-Open No. HEI9-17965, the power supply voltage of the memory cell is increased from the ordinary power supply voltage Vcc to a higher power supply voltage Vcc' in order to write the data stored in the flip-flop circuit into the ferroelectric capacitors and in order to write the data stored in the ferroelectric capacitors into the flip-flop circuit as explained above. Due to the need of increasing the power supply voltage of the memory cell into a voltage higher than the ordinary power supply voltage Vcc, the use of generally-used high-performance devices becomes difficult or impossible.

SUMMARY OF THE INVENTION

It is therefore the primary object of the present invention to provide a memory cell of shadow RAM employing ferroelectric capacitors, a nonvolatile memory device, and a control method for the memory cell, by which the storing operation can be carried out with high reliability even if the power supply voltage decreased.

Another object of the present invention is to provide a memory cell of shadow RAM employing ferroelectric capacitor, a nonvolatile memory device, and a control method for the memory cell, by which the recall operation can be carried out with high reliability even if the power supply voltage decreased.

In accordance with a first aspect of the present invention, there is provided a memory cell comprising: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes. Storing operation of the memory cell is carried out by swinging the voltage of the plate line between a first voltage that is higher than power supply voltage of the memory cell and a second voltage that is lower than the ground potential while keeping the pair of switching elements in off states (hereafter, referred to as "first storing operation").

By driving the plate line to the first voltage that is higher than the power supply voltage in the storing operation, a negative bias voltage (ground potential—first voltage) that is lower (higher in the absolute value) than the inverse of the power supply voltage (—power supply voltage) can be applied to a ferroelectric capacitor that is connected to a memory node holding data at the ground potential. By the enhancement of the negative bias voltage, nonvolatile memory with high reliability can be realized even if the power supply voltage became lower due to the miniaturization of the integrated circuit etc.

By driving the plate line to the second voltage lower than the ground potential in the storing operation, a positive bias voltage (power supply voltage—second voltage) that is higher than the power supply voltage can be applied to a ferroelectric capacitor that is connected to a memory node holding data at the power supply voltage. By the enhancement of the positive bias voltage, nonvolatile memory with high reliability can be realized even if the power supply voltage became lower due to the miniaturization of the integrated circuit etc.

In accordance with a second aspect of the present invention, storing operation of the memory cell is carried out by swinging the voltage of the plate line between power supply voltage of the memory cell and a second voltage that is lower than the ground potential while keeping the pair of switching elements in off states (hereafter, referred to as "second storing operation").

In accordance with a third aspect of the present invention, storing operation of the memory cell is carried out by swinging the voltage of the plate line between a first voltage that is higher than power supply voltage of the memory cell and the ground potential while keeping the pair of switching elements in off states (hereafter, referred to as "third storing operation").

In accordance with a fourth aspect of the present invention, recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states (hereafter, referred to as "first recall operation").

By driving the plate line to the third voltage (higher than the power supply voltage) keeping the supply voltage of the memory cell (flip-flop) at the ground potential (keeping switching elements in off states) in the recall operation, negative voltages are applied to the ferroelectric capacitors and thereby a voltage difference is caused to the pair of memory nodes. Thereafter, by raising the supply voltage of the memory cell (flip-flop), the voltage difference between the memory nodes is amplified and thereby the data is recalled and restored. By raising the plate line voltage to the high voltage (third voltage), higher bias voltages can be applied to the ferroelectric capacitors in comparison with conventional shadow RAM raising the plate line voltage to the power supply voltage (Japanese Patent No.2693967, for example), thereby nonvolatile memory with high reliability can be realized even if the power supply voltage became lower due to the miniaturization of the integrated circuit etc.

In accordance with a fifth aspect of the present invention, recall operation of the memory cell is carried out by driving the plate line to a fourth voltage that is lower than the ground potential and raising supply voltage of the memory cell from the ground potential to the power supply voltage of the memory cell while keeping the pair of switching elements in off states (hereafter, referred to as "second recall operation").

By driving the plate line to the fourth voltage (lower than the ground potential) concurrently with the raising of the supply voltage of the memory cell (flip-flop), positive voltages are applied to the ferroelectric capacitors and thereby a voltage difference is caused to the pair of memory nodes. Thereafter, by raising the supply voltage of the memory cell (flip-flop), the voltage difference between the memory nodes is amplified and thereby the data is recalled and restored. By dropping the plate line voltage to the negative voltage (fourth voltage), higher bias voltages can be applied to the ferroelectric capacitors in comparison with conventional shadow RAM fixing the plate line voltage to the ground potential (Japanese Patent Application Laid-Open No.2000-293989, for example), thereby nonvolatile memory with high reliability can be realized even if the power supply voltage became lower due to the miniaturization of the integrated circuit etc.

In accordance with a sixth aspect of the present invention, in the first aspect, recall operation of the memory cell is carried out according to the first recall operation.

In accordance with a seventh aspect of the present invention, in the sixth aspect, the third voltage is set equal to the first voltage.

In accordance with an eighth aspect of the present invention, in the first aspect, recall operation of the memory cell is carried out according to the second recall operation.

In accordance with a ninth aspect of the present invention, in the eighth aspect, the fourth voltage is set equal to the second voltage.

In accordance with a tenth aspect of the present invention, in the second aspect, recall operation of the memory cell is carried out according to the first recall operation.

In accordance with an eleventh aspect of the present invention, in the second aspect, recall operation of the memory cell is carried out according to the second recall operation.

In accordance with a twelfth aspect of the present invention, in the eleventh aspect, the fourth voltage is set equal to the second voltage.

In accordance with a thirteenth aspect of the present invention, in the third aspect, recall operation of the memory cell is carried out according to the first recall operation.

In accordance with a fourteenth aspect of the present invention, in the thirteenth aspect, the third voltage is set equal to the first voltage.

In accordance with a fifteenth aspect of the present invention, in the third aspect, recall operation of the memory cell is carried out according to the second recall operation.

In accordance with a sixteenth aspect of the present invention, in the sixth aspect, the memory cell includes a pair of logic inversion elements which are connected together in ring connection so that each of the memory nodes will be formed between the output terminal of one logic inversion element and the input terminal of the other logic inversion element.

In accordance with a seventeenth aspect of the present invention, in the sixteenth aspect, the switching elements are implemented by MOS transistors.

In accordance with an eighteenth aspect of the present invention, in the sixteenth aspect, the switching elements and the logic inversion elements are implemented by a 6-transistor CMOS flip-flop.

In accordance with a nineteenth aspect of the present invention, in the sixteenth aspect, the switching elements and the logic inversion elements are implemented by a high-resistance-load 4-transistor flip-flop.

In accordance with a twentieth aspect of the present invention, in the sixteenth aspect, the switching elements and the logic inversion elements are implemented by a loadless 4-transistor flip-flop.

In accordance with a twenty-first aspect of the present invention, in the eighth aspect, the memory cell includes a pair of logic inversion elements which are connected together in ring connection so that each of the memory nodes will be formed between the output terminal of one logic inversion element and the input terminal of the other logic inversion element.

In accordance with a twenty-second aspect of the present invention, in the twenty-first aspect, the switching elements are implemented by MOS transistors.

In accordance with a twenty-third aspect of the present invention, in the twenty-first aspect, the switching elements and the logic inversion elements are implemented by a 6-transistor CMOS flip-flop.

In accordance with a twenty-fourth aspect of the present invention, in the twenty-first aspect, the switching elements and the logic inversion elements are implemented by a high-resistance-load 4-transistor flip-flop.

In accordance with a twenty-fifth aspect of the present invention, in the twenty-first aspect, the switching elements and the logic inversion elements are implemented by a loadless 4-transistor flip-flop.

In accordance with a twenty-sixth aspect of the present invention, there is provided a nonvolatile memory device comprising memory cells that are arranged in a matrix. The memory cell includes: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes. In the nonvolatile memory device, at least storing operation or recall operation of each memory cell is carried out according to operation selected from: (A) first storing operation in which the voltage of the plate line is swung between a first voltage that is higher than power supply voltage of the memory cell and a second voltage that is lower than the ground potential while keeping the pair of switching elements in off states; (B) second storing operation in which the voltage of the plate line is swung between the power supply voltage of the memory cell and a second voltage that is lower than the ground potential while keeping the pair of switching elements in off states; (C) third storing operation in which the voltage of the plate line is swung between a first voltage that is higher than the power supply voltage of the memory cell and the ground potential while keeping the pair of switching elements in off states; (D) first recall operation in which the plate line is driven to a third voltage that is higher than power supply voltage of the memory cell and thereafter supply voltage of the memory cell is raised from the ground potential to the power supply voltage of the memory cell while keeping the pair of switching elements in off states; and (E) second recall operation in which the plate line is driven to a fourth voltage that is lower than the ground potential and supply voltage of the memory cell is raised from the ground potential to the power supply voltage of the memory cell while keeping the pair of switching elements in off states.

In accordance with a twenty-seventh aspect of the present invention, in the twenty-sixth aspect, all the memory cells are connected to a common plate line.

In accordance with a twenty-eighth aspect of the present invention, in the twenty-seventh aspect, the nonvolatile memory device further comprises a plate line driving circuit for driving the common plate line.

In accordance with a twenty-ninth aspect of the present invention, in the twenty-eighth aspect, the nonvolatile memory device further comprises a high voltage generation circuit for generating a voltage higher than the power supply voltage and supplying the high voltage to the plate line driving circuit.

In accordance with a thirtieth aspect of the present invention, in the twenty-eighth aspect, the nonvolatile memory device further comprises a negative voltage generation circuit for generating a negative voltage and supplying the negative voltage to the plate line driving circuit.

In accordance with a thirty-first aspect of the present invention, in the twenty-ninth aspect, the nonvolatile memory device further comprises a negative voltage generation circuit for generating a negative voltage and supplying the negative voltage to the plate line driving circuit.

In accordance with a thirty-second aspect of the present invention, in the twenty-ninth aspect, the memory cells are implemented by devices of normal withstand voltages, and the plate line driving circuit and the high voltage generation circuit are implemented by devices of high withstand voltages.

In accordance with a thirty-third aspect of the present invention, in the thirtieth aspect, the memory cells are implemented by devices of normal withstand voltages, and the plate line driving circuit and the negative voltage generation circuit are implemented by devices capable of operating under negative voltages.

In accordance with a thirty-fourth aspect of the present invention, in the twenty-eighth aspect, the plate line driving circuit raises the voltage of the common plate line from a preset voltage that is between the ground potential and the power supply voltage to the first voltage and thereafter drops the voltage to the second voltage in the storing operation.

In accordance with a thirty-fifth aspect of the present invention, in the twenty-eighth aspect, the plate line driving circuit drops the voltage of the common plate line from a preset voltage that is between the ground potential and the power supply voltage to the second voltage and thereafter raises the voltage to the first voltage in the storing operation.

In accordance with a thirty-sixth aspect of the present invention, in the twenty-eighth aspect, the plate line driving circuit raises the voltage of the common plate line from a preset voltage that is between the ground potential and the power supply voltage to the power supply voltage and thereafter drops the voltage to the second voltage in the storing operation.

In accordance with a thirty-seventh aspect of the present invention, in the twenty-eighth aspect, the plate line driving circuit drops the voltage of the common plate line from a preset voltage that is between the ground potential and the power supply voltage to the second voltage and thereafter raises the voltage to the power supply voltage in the storing operation.

In accordance with a thirty-eighth aspect of the present invention, in the twenty-eighth aspect, the plate line driving circuit raises the voltage of the common plate line from a preset voltage that is between the ground potential and the power supply voltage to the first voltage and thereafter drops the voltage to the ground potential in the storing operation.

In accordance with a thirty-ninth aspect of the present invention, in the twenty-eighth aspect, the plate line driving circuit drops the voltage of the common plate line from a preset voltage that is between the ground potential and the power supply voltage to the ground potential and thereafter raises the voltage to the first voltage in the storing operation.

In accordance with a fortieth aspect of the present invention, in the twenty-eighth aspect, the plate line driving circuit raises the voltage of the common plate line to the third voltage before the supply voltage of the memory cells is raised in the recall operation.

In accordance with a forty-first aspect of the present invention, in the twenty-eighth aspect, the plate line driving circuit drops the voltage of the common plate line to the fourth voltage almost concurrently with the raising of the supply voltage of the memory cells in the recall operation.

In accordance with a forty-second aspect of the present invention, there is provided a control method for a memory cell that comprises: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes. In the control method, storing operation of the memory cell is carried out by swinging the voltage of the plate line between a first voltage that is higher than power supply voltage of the memory cell and a second voltage that is lower than the ground potential while keeping the pair of switching elements in off states (first storing operation).

In accordance with a forty-third aspect of the present invention, storing operation of the memory cell is carried out by swinging the voltage of the plate line between power supply voltage of the memory cell and a second voltage that is lower than the ground potential while keeping the pair of switching elements in off states (second storing operation).

In accordance with a forty-fourth aspect of the present invention, storing operation of the memory cell is carried out by swinging the voltage of the plate line between a first voltage that is higher than power supply voltage of the memory cell and the ground potential while keeping the pair of switching elements in off states (third storing operation).

In accordance with a forty-fifth aspect of the present invention, recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states (first recall operation).

In accordance with a forty-sixth aspect of the present invention, recall operation of the memory cell is carried out by driving the plate line to a fourth voltage that is lower than the ground potential and raising supply voltage of the memory cell from the ground potential to the power supply voltage of the memory cell while keeping the pair of switching elements in off states (second recall operation).

In accordance with a forty-seventh aspect of the present invention, in the forty-second aspect, recall operation of the memory cell is carried out according to the first recall operation.

In accordance with a forty-eighth aspect of the present invention, in the forty-seventh aspect, the third voltage is set equal to the first voltage.

In accordance with a forty-ninth aspect of the present invention, in the forty-second aspect, recall operation of the memory cell is carried out according to the second recall operation.

In accordance with a fiftieth aspect of the present invention, in the forty-ninth aspect, the fourth voltage is set equal to the second voltage.

In accordance with a fifty-first aspect of the present invention, in the forty-third aspect, recall operation of the memory cell is carried out according to the first recall operation.

In accordance with a fifty-second aspect of the present invention, in the forty-third aspect, recall operation of the memory cell is carried out according to the second recall operation.

In accordance with a fifty-third aspect of the present invention, in the fifty-second aspect, the fourth voltage is set equal to the second voltage.

In accordance with a fifty-fourth aspect of the present invention, in the forty-fourth aspect, recall operation of the memory cell is carried out according to the first recall operation.

In accordance with a fifty-fifth aspect of the present invention, in the fifty-fourth aspect, the third voltage is set equal to the first voltage.

In accordance with a fifty-sixth aspect of the present invention, in the forty-fourth aspect, recall operation of the memory cell is carried out according to the second recall operation.

BRIEF DESCRIPTION OF THE DRAWINGS

The objects and features of the present invention will become more apparent from the consideration of the following detailed description taken in conjunction with the accompanying drawings, in which:

FIG. 14 is a circuit diagram showing a memory cell of shadow RAM employing ferroelectric capacitors in accordance with an embodiment of the present invention;

DESCRIPTION OF THE PREFERRED EMBODIMENTS

Figure 1:
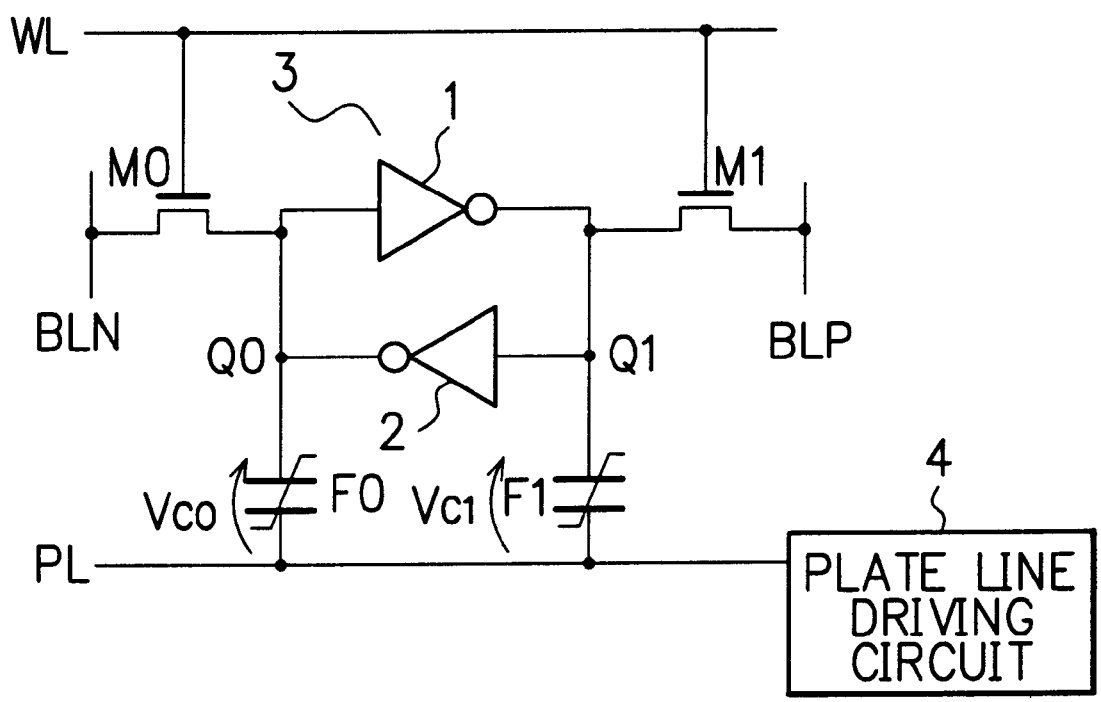
FIG. 1 is a circuit diagram showing the composition of a memory cell of shadow RAM employing ferroelectric capacitors which has been disclosed in Japanese Patent Application Laid-Open No.2000-293989.
Figure 2:
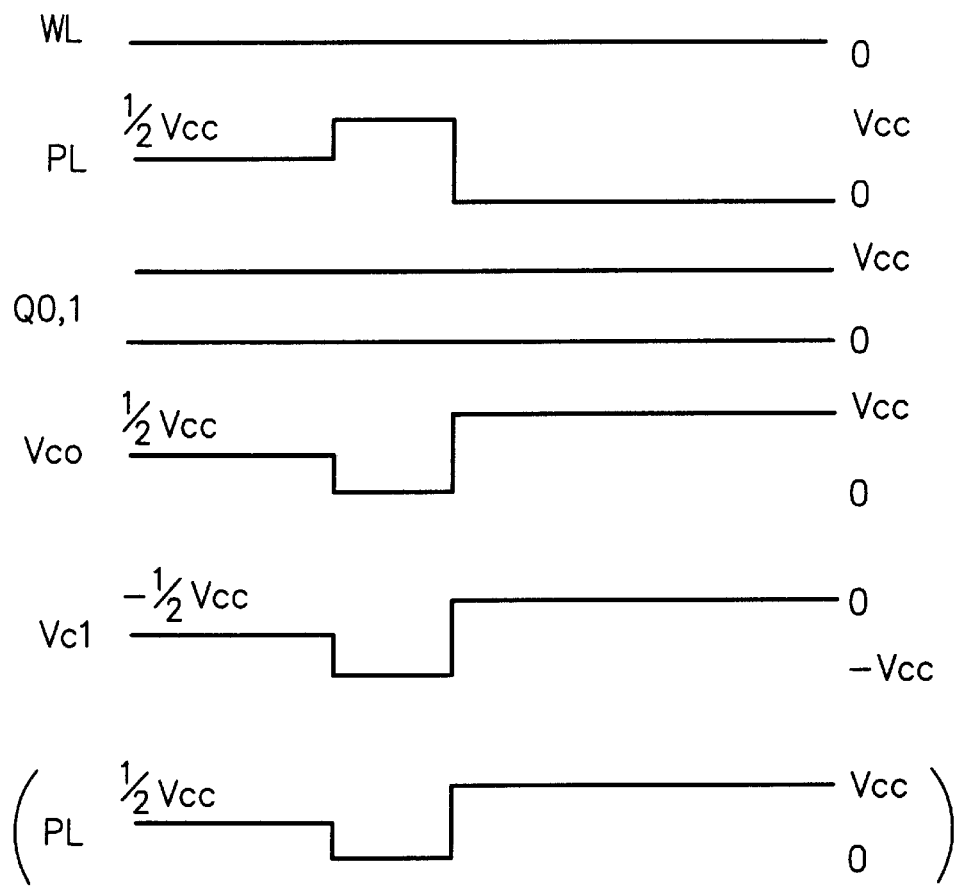
FIG. 2 is a timing chart showing the change of voltage of each part of the memory cell of FIG. 1 during the storing operation.
Figure 3:
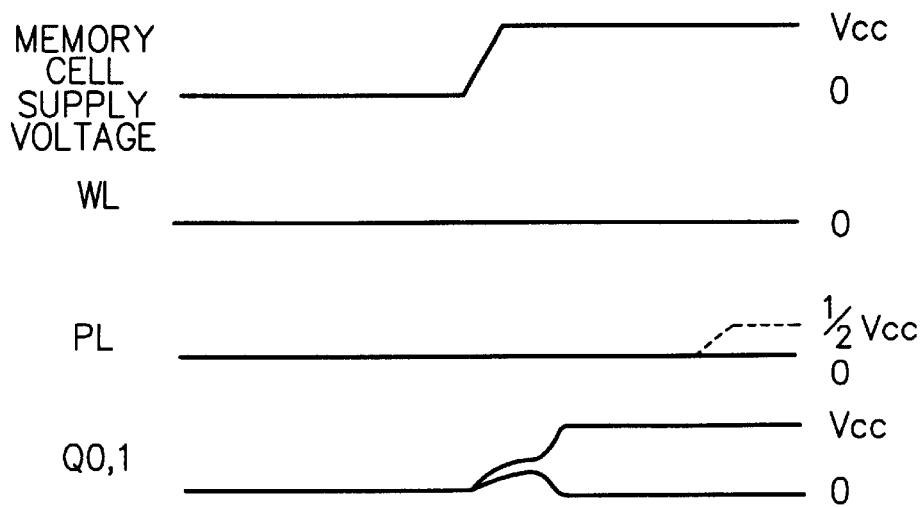
FIG. 3 is a timing chart showing the change of voltage of each part of the memory cell of FIG. 1 during the recall operation.

Referring now to the drawings, a description will be given in detail of preferred embodiments in accordance with the present invention.

Figure 4:
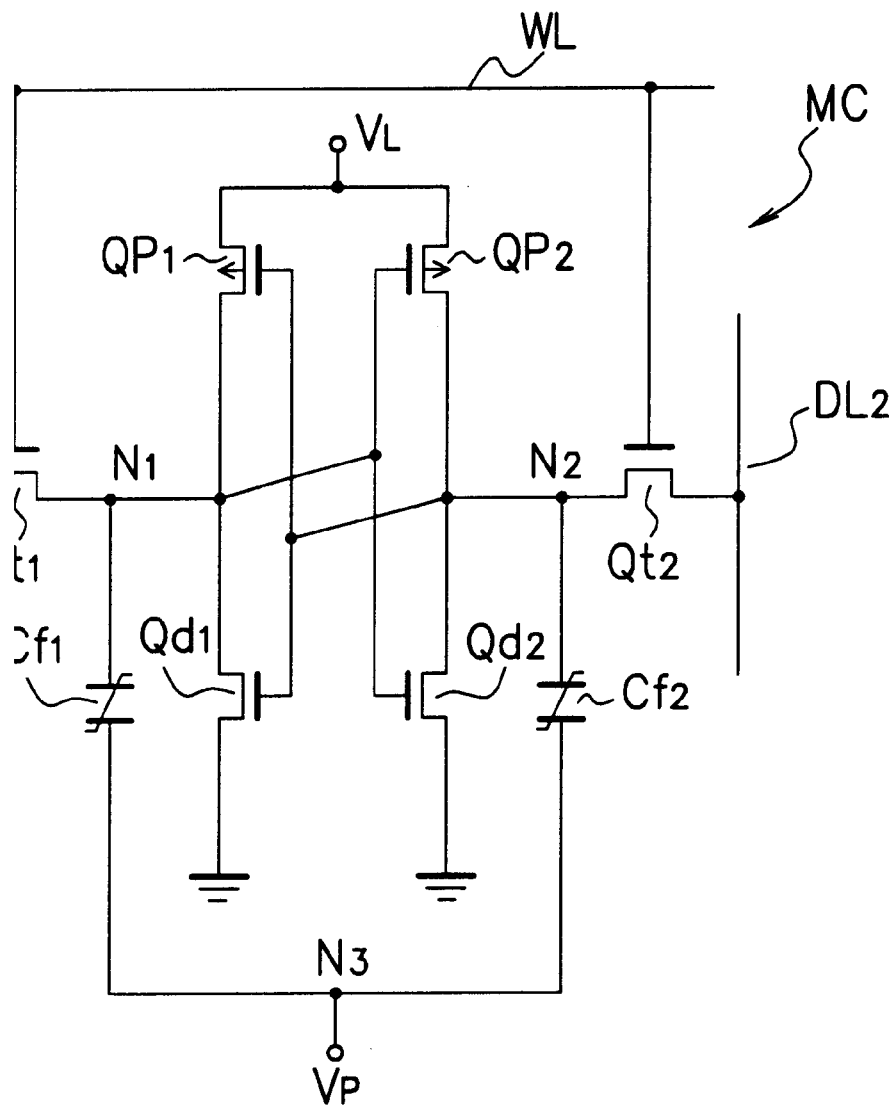
FIG. 4 is a circuit diagram showing the composition of a conventional semiconductor memory which has been disclosed in Japanese Patent Application Laid-Open No.HEI9-17965.
Figure 5:
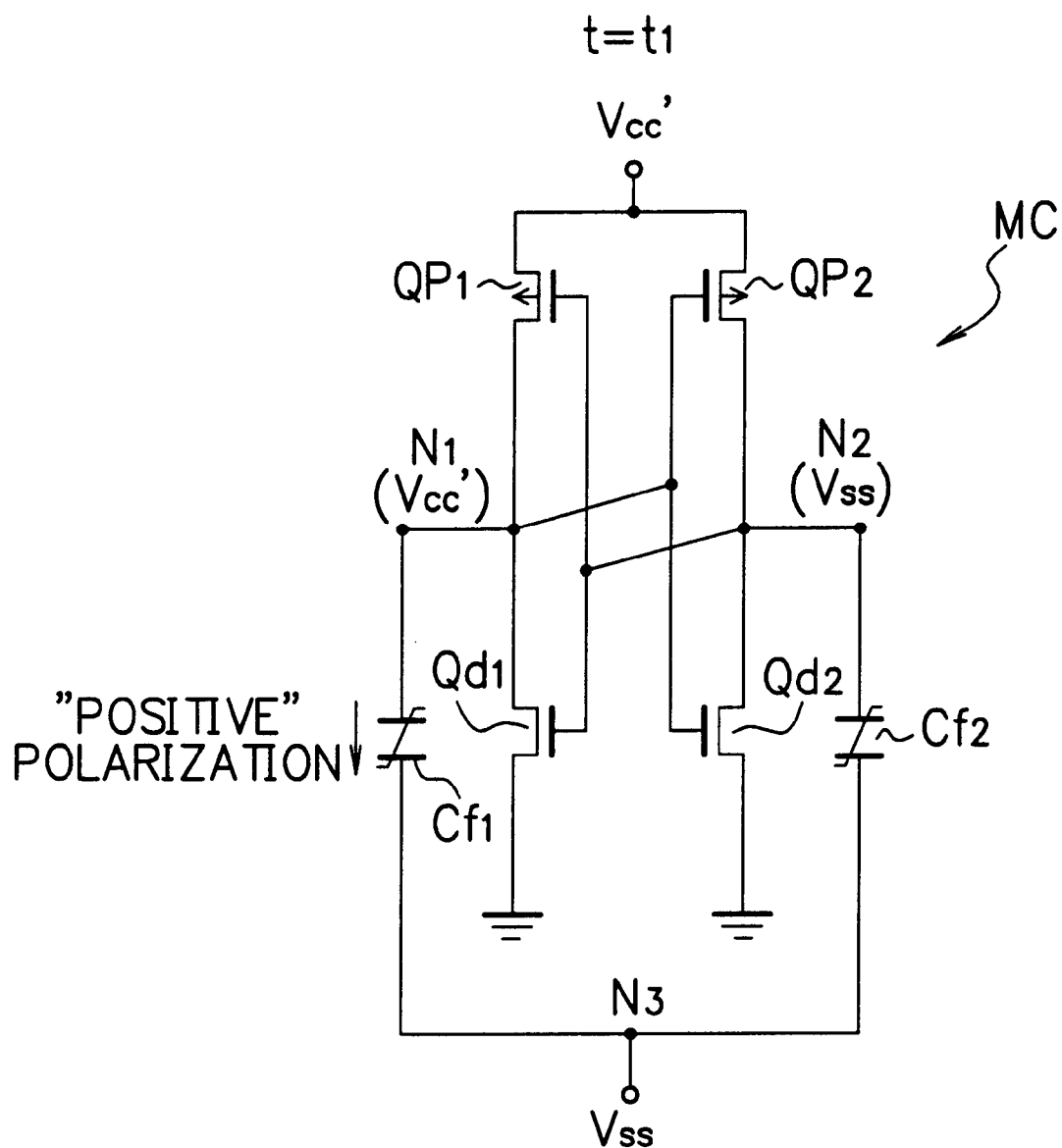
FIGS. 5 and 6 are circuit diagrams for explaining data readout from a flip-flop circuit to ferroelectric capacitors $Cf_1$ and $Cf_2$ in the conventional semiconductor memory of FIG. 4.
Figure 6:
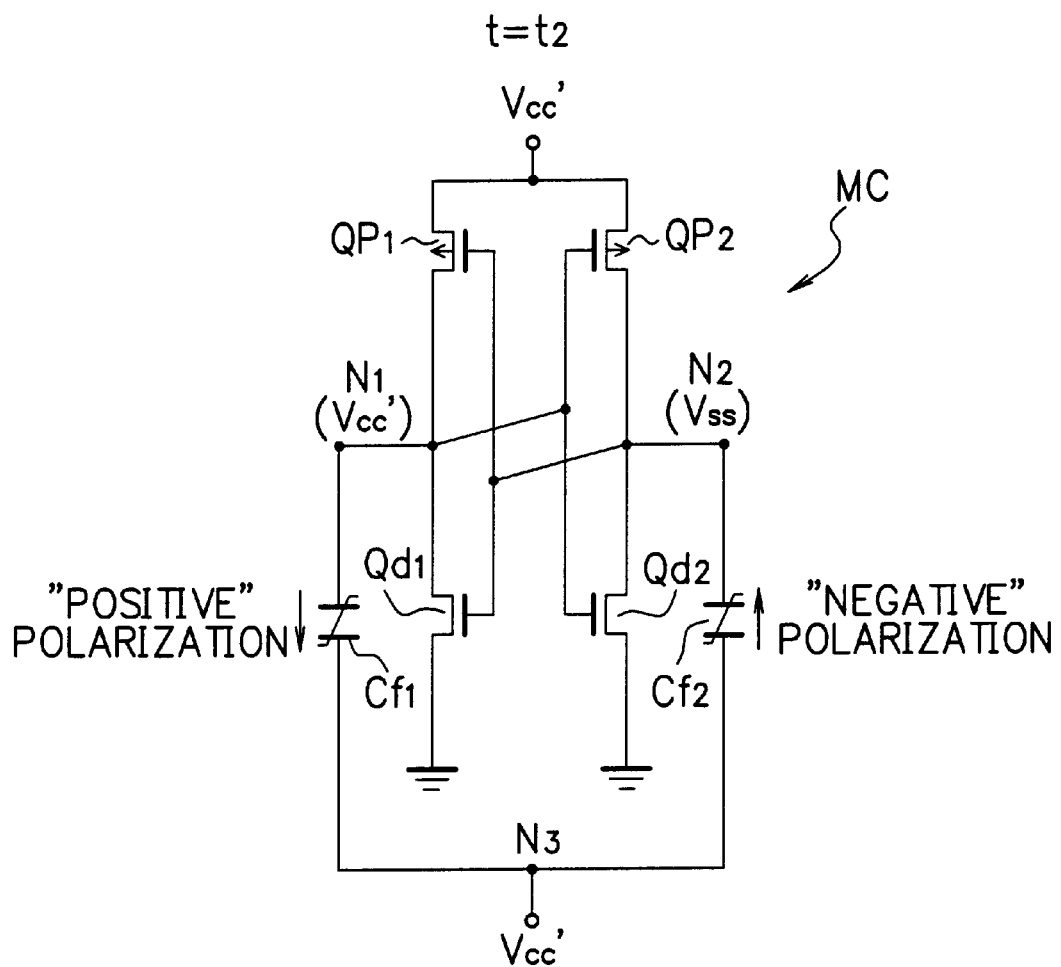
Figure 7:
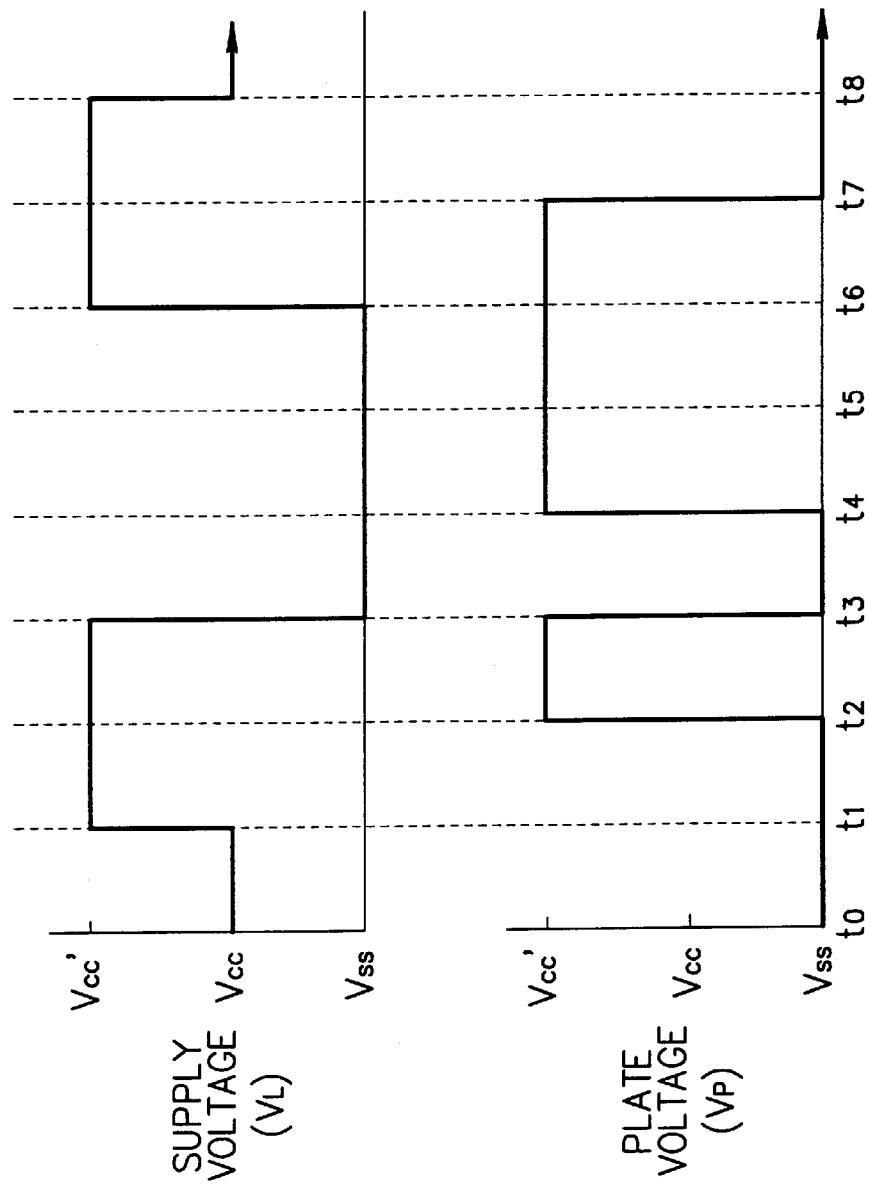
FIG. 7 is a timing chart showing the change of supply voltage $V_L$ of the flip flop circuit and plate voltage $V_P$ in the conventional semiconductor memory of FIG. 4.
Figure 8:
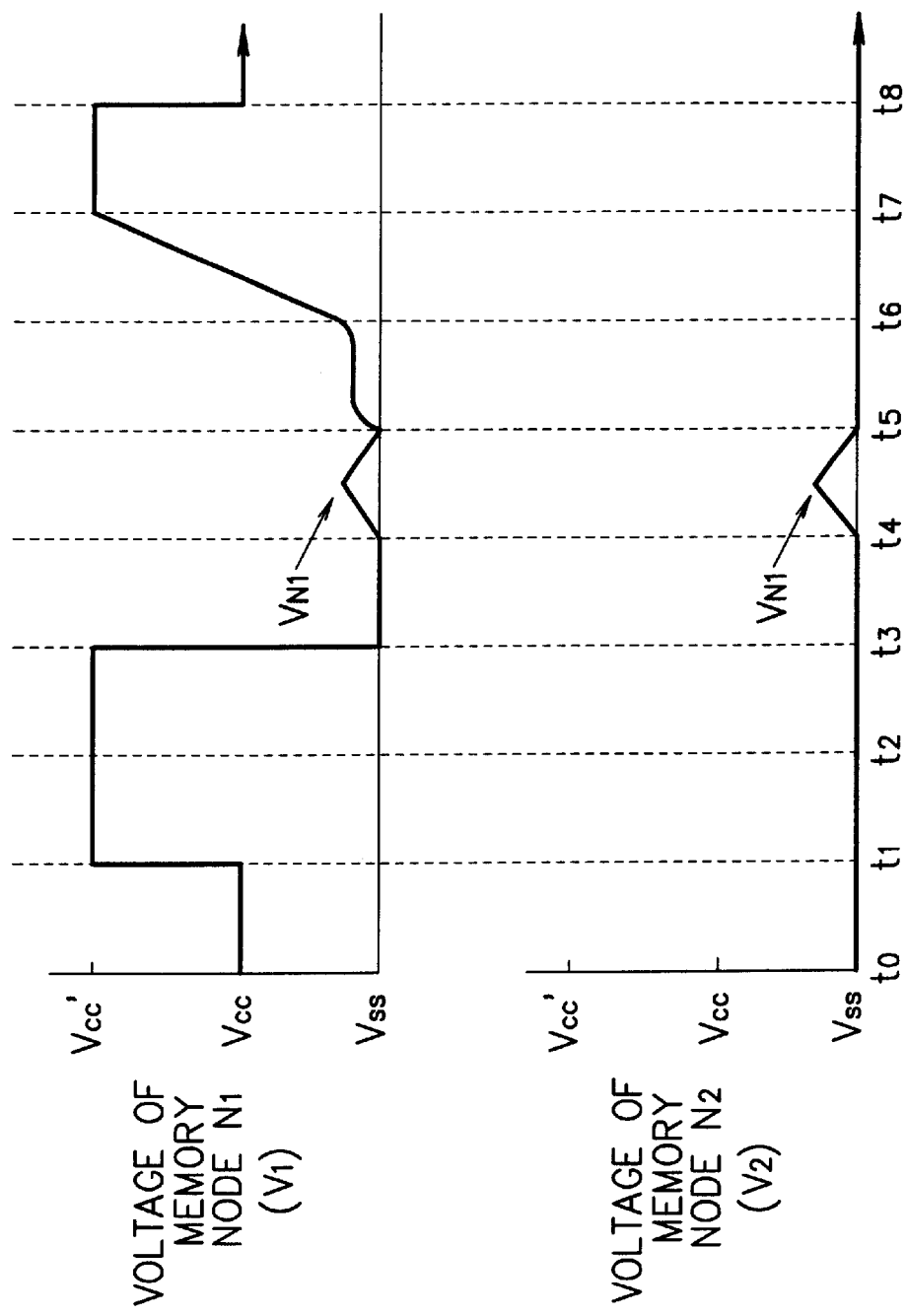
FIG. 8 is a timing chart showing the change of the voltages of memory nodes $N_1$ and $N_2$ of the conventional semiconductor memory of FIG. 4.
Figure 9:
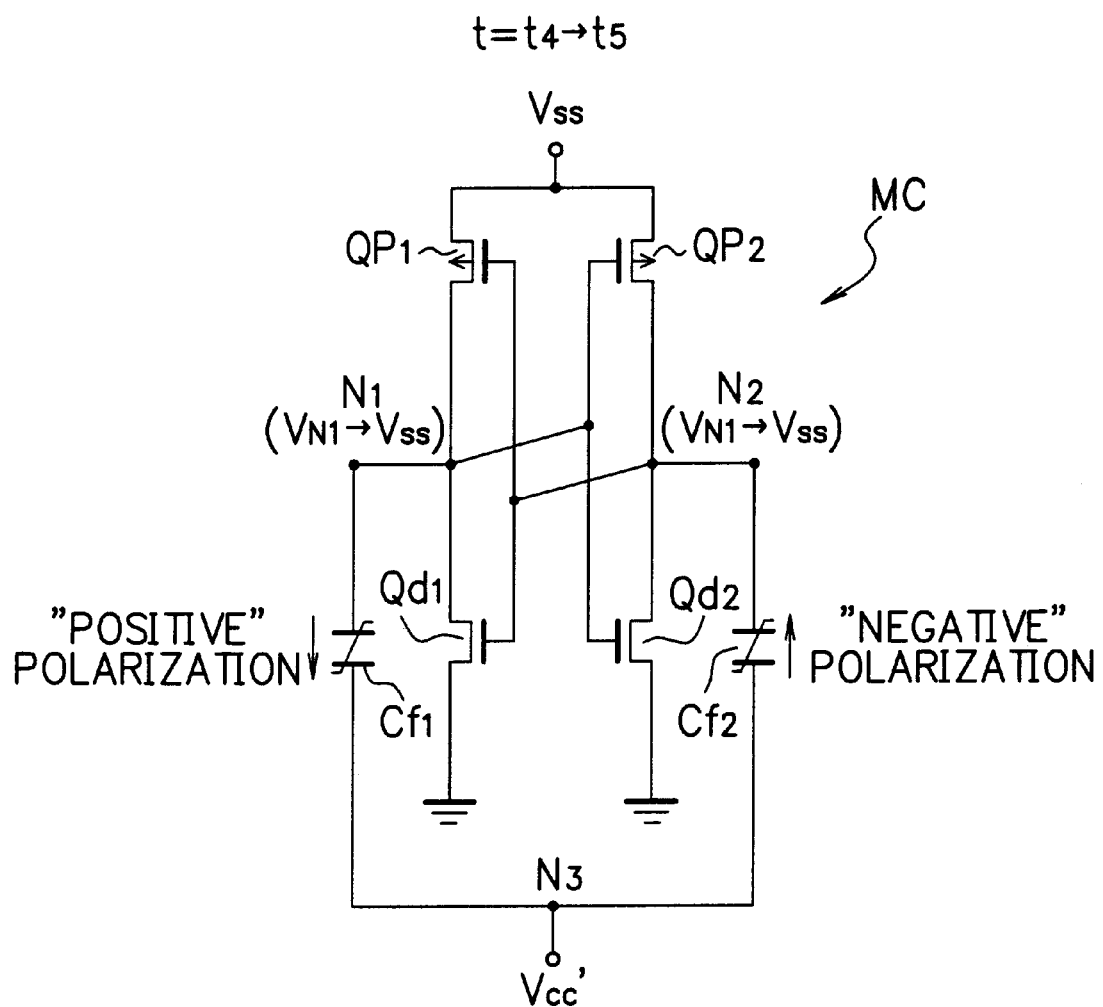
FIGS. 9 through 13 are circuit diagrams for explaining data writing from the ferroelectric capacitors $Cf_1$ and $Cf_2$ to the flip-flop circuit in the conventional semiconductor memory of FIG. 4.
Figure 10:
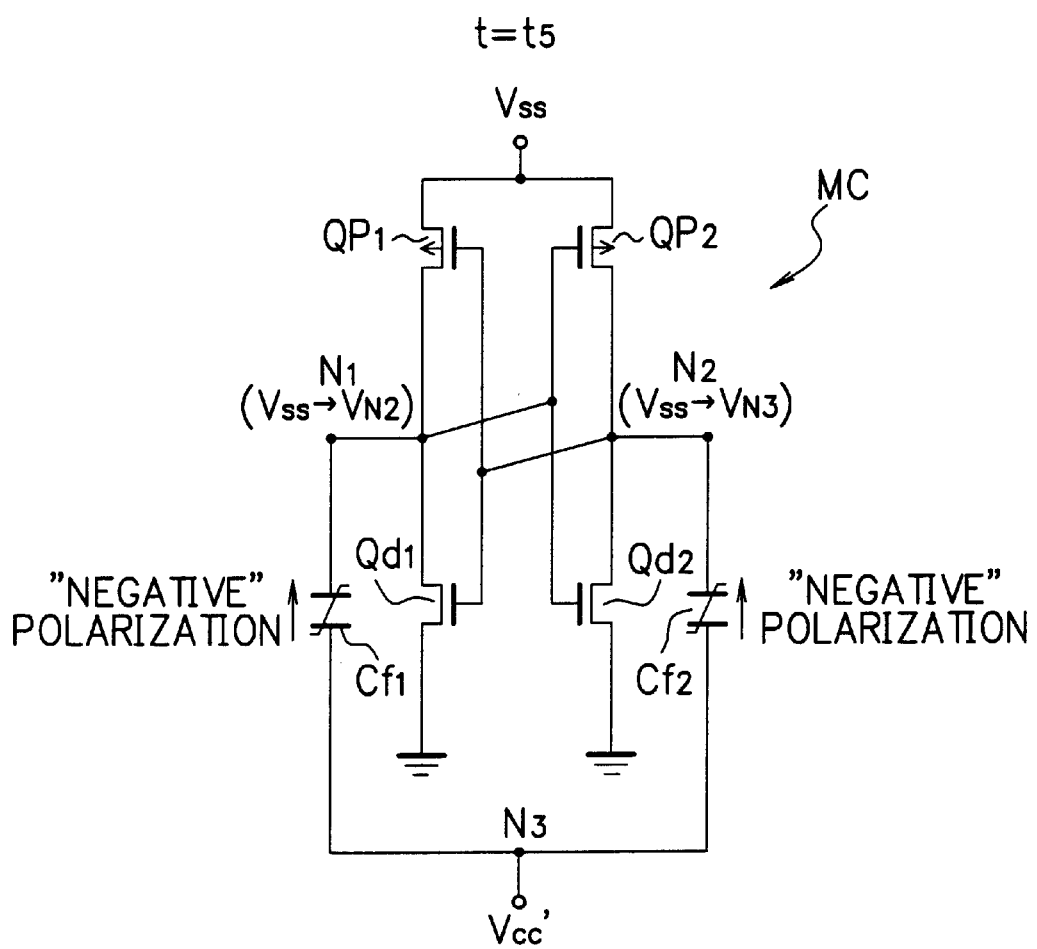
Figure 11:
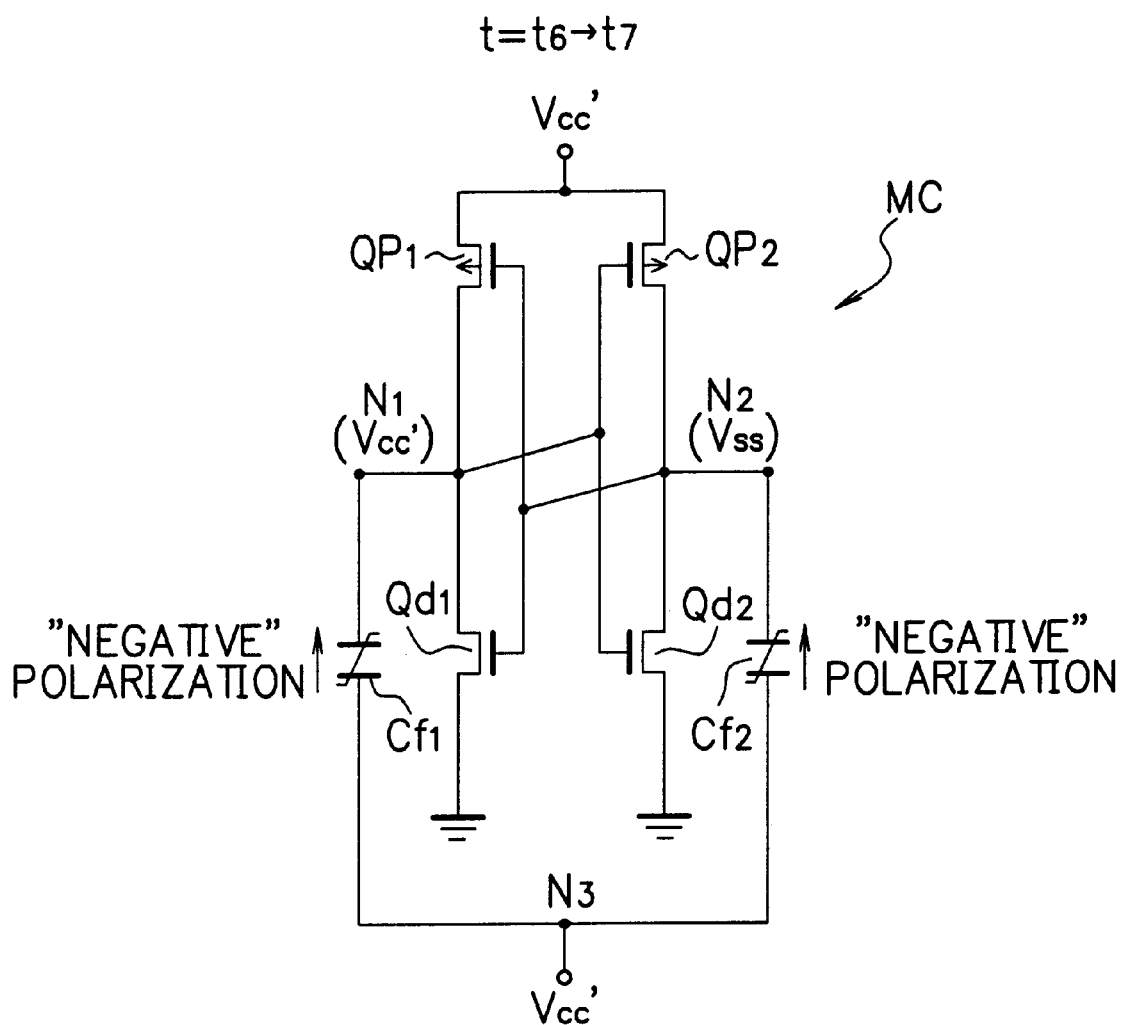
Figure 12:
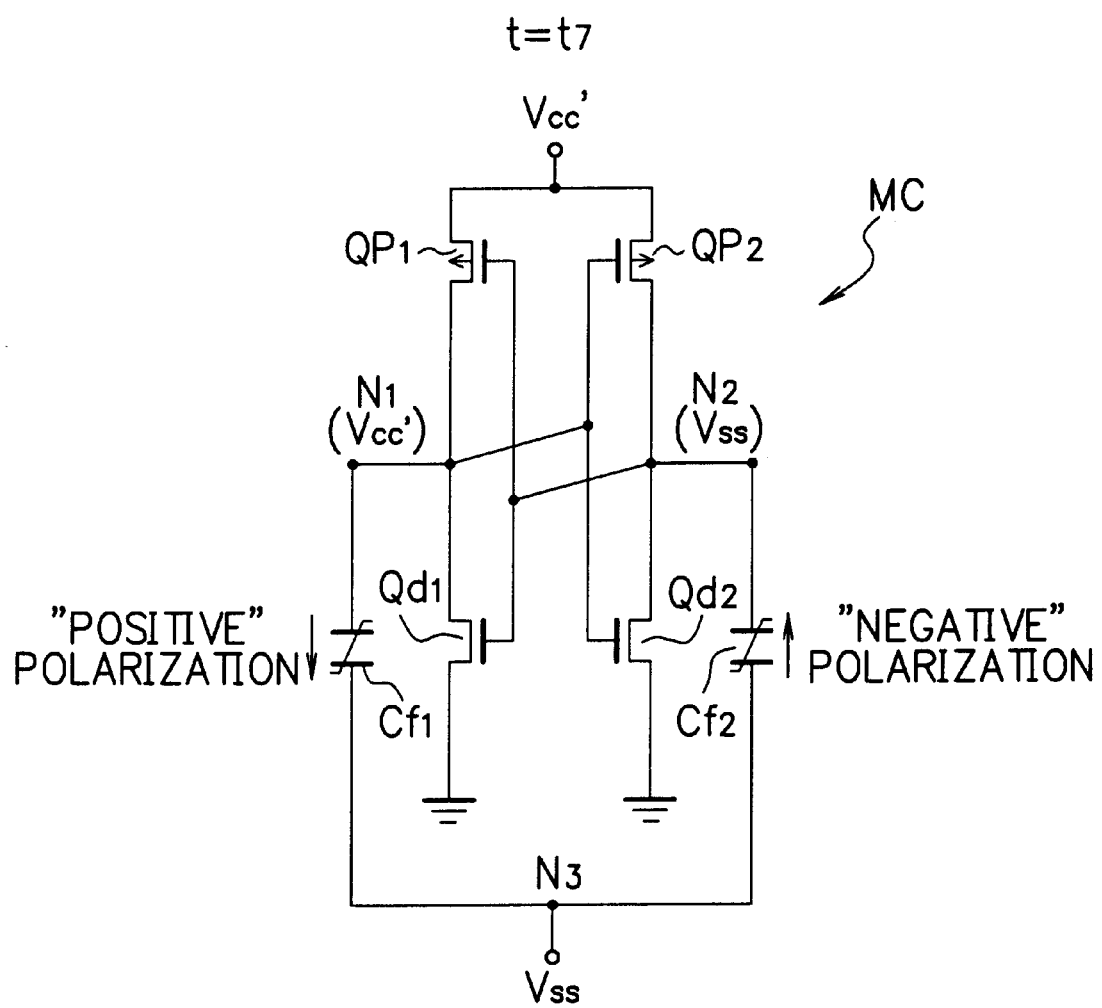
Figure 13:
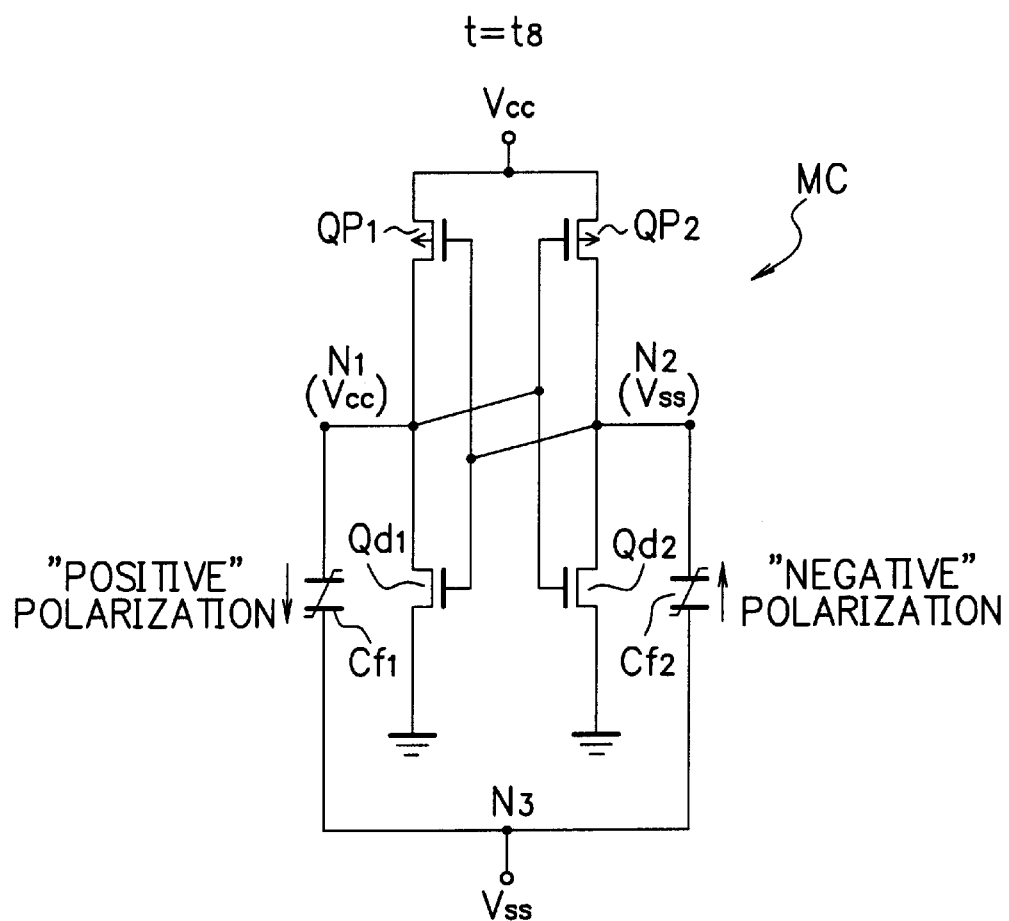

FIG. 14 is a circuit diagram showing a memory cell of shadow RAM employing ferroelectric capacitors in accordance with an embodiment of the present invention, wherein the same reference characters as those of FIG. 1 designate the same or equivalent parts to those of FIG. 1. The shadow RAM memory cell of this embodiment includes a flip-flop 3 and a pair of ferroelectric capacitors F0 and F1. An end of each ferroelectric capacitor (F0, F1) is connected to a corresponding memory node (Q1, Q2), and the other ends of the ferroelectric capacitors F0 and F1 are connected to a plate line PL. As the flip-flop 3, various types of flip-flops, such as a 6-transistor CMOS flip-flop (shown in FIG. 4), a high-resistance-load 4-transistor flip-flop (shown in FIG. 15), a loadless 4-transistor flip-flop (shown in FIG. 16), etc. which are generally used as SRAM cells, can be employed. In this explanation, a case where the 6-transistor CMOS flip-flop is used will be described as an example.

The difference between the embodiment of FIG. 14 and the prior art of FIG. 1 exists in the operation of the plate line driving circuit 4. The plate line driving circuit 4 of the prior art of FIG. 1 drives the plate line PL between the ground potential and the power supply voltage Vcc only, whereas the plate line driving circuit 4 of FIG. 14 drives the plate line PL to a negative voltage or a voltage higher than the power supply voltage Vcc. Therefore, the plate line driving circuit 4 of this embodiment is provided with a high voltage generation circuit 5 for generating a voltage higher than the power supply voltage and supplying the high voltage to the plate line driving circuit 4 and a negative voltage generation circuit 6 for generating a negative voltage and supplying the negative voltage to the plate line driving circuit 4.

In the following, the operation of the shadow RAM employing ferroelectric capacitors in accordance with the embodiment of the present invention will be explained in detail. Incidentally, the data reading/writing from/to the shadow RAM when power is being supplied to the shadow RAM is carried out in the same way as the conventional shadow RAM, and thus repeated description thereof is omitted for brevity.

Figure 15:
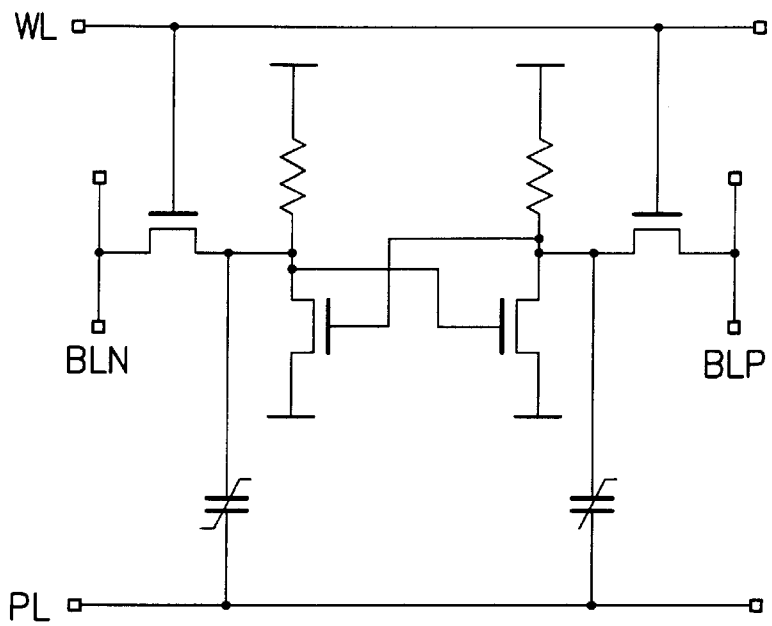
FIG. 15 is a circuit diagram showing a high-resistance-load 4-transistor flip-flop which can be employed as a flip-flop 3 of the memory cell of FIG. 14.
Figure 16:
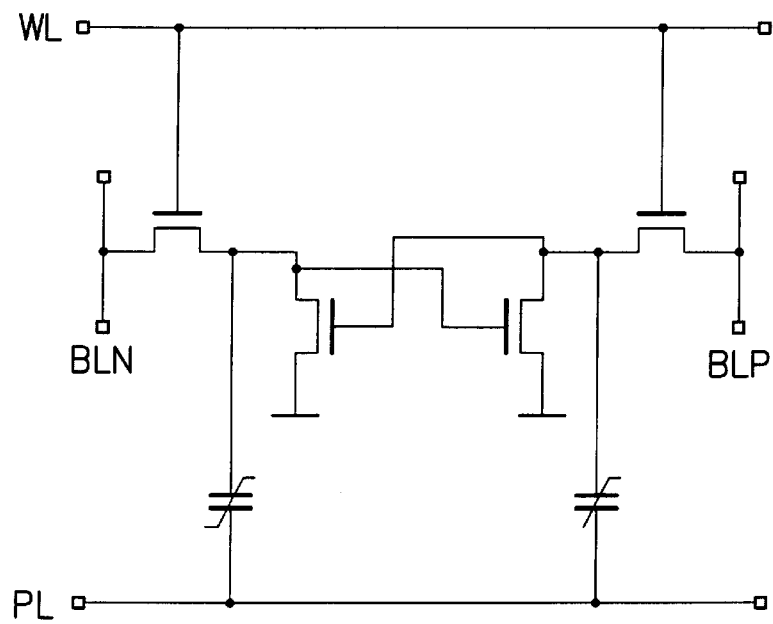
FIG. 16 is a circuit diagram showing a loadless 4-transistor flip-flop which can be employed as the flip-flop 3 of the memory cell of FIG. 14.
Figure 17:
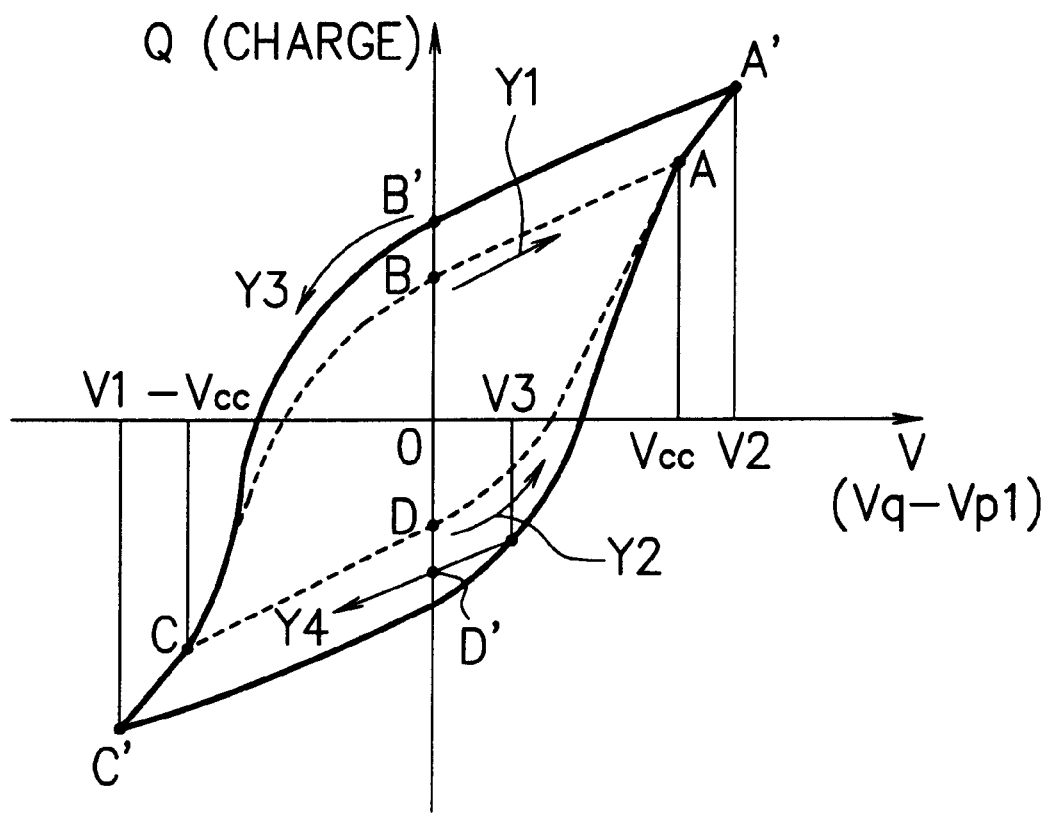
FIG. 17 is a graph showing the hysteresis characteristics of the ferroelectric capacitors of the memory cell of FIG. 14 on a Q-V plane.
Figure 18:
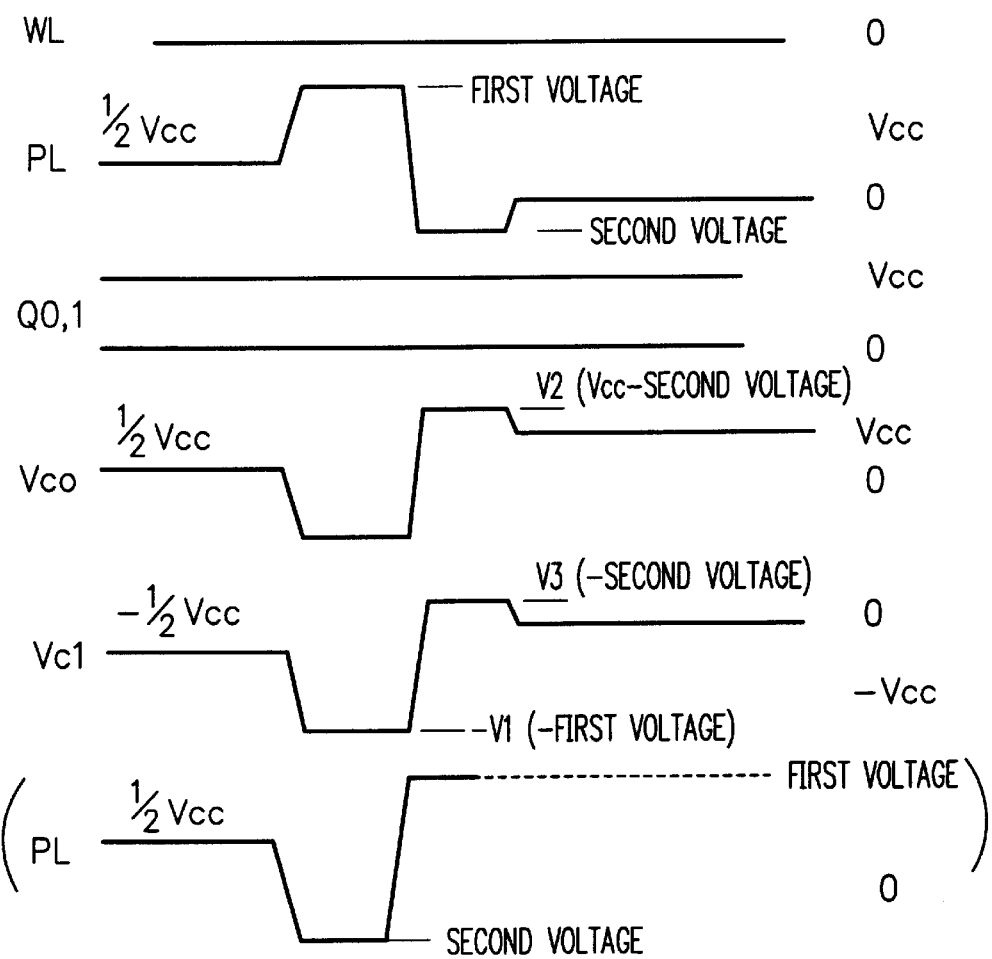
FIG. 18 is a timing chart showing the change of the voltage of each part of the memory cell of FIG. 14 during the storing operation.

At the start, the first storing operation which can be employed in this embodiment will be explained referring to FIGS. 15 and 16. Incidentally, FIG. 17 is a graph showing the hysteresis characteristics of the ferroelectric capacitors F0 and F1 of the memory cell of FIG. 14 on a Q-V plane. FIG. 18 is a timing chart showing the change of the voltage of each part of the memory cell of FIG. 14 during the storing operation. Also in the shadow RAM of the present invention, the "storing", for transferring data stored in the flip-flop 3 (memory nodes Q0 and Q1) to the ferroelectric capacitors F0 and F1 (as remanent polarization) when the power is shut off, is carried out similarly to the conventional shadow RAM. The storing operation in this embodiment is executed by driving the plate line PL from Vcc/2 to a first voltage that is higher than the power supply voltage Vcc and thereafter to a second voltage that is lower than the ground potential (0V) while maintaining the word line WL at the low level. Incidentally, it is also possible to drive the plate line PL from Vcc/2 to the second voltage (which is lower than 0V) and thereafter to the first voltage (which is higher than Vcc) for the first storing operation as shown in the lowermost line of FIG. 18.

By the increase of the plate line voltage from Vcc/2 to the first voltage, a voltage difference (first voltage–power supply voltage) is applied to a ferroelectric capacitor that is connected to a memory node holding the power supply voltage, and a voltage difference −V1 (ground potential–first voltage) is applied to a ferroelectric capacitor that is connected to a memory node holding the ground potential. The ferroelectric capacitor to which the voltage difference −V1 is applied moves to a point C' of FIG. 17. Thereafter, the plate line voltage is dropped to the second voltage, thereby a voltage difference V2 (power supply voltage−second voltage) is applied to the ferroelectric capacitor that is connected to the memory node holding the power supply voltage, and a voltage difference V3 (ground potential−second voltage) is applied to the ferroelectric capacitor that is connected to the memory node holding the ground potential. The ferroelectric capacitor to which the voltage difference V2 is applied moves to a point A' of FIG. 17.

Finally, when the power is shut off and all the memory nodes are discharged to the ground potential, the ferroelectric capacitor that is connected to the memory node that has been holding the power supply voltage holds a remanent polarization Pr (B') that is larger than Pr (B) at a point B' of FIG. 17, and the ferroelectric capacitor that is connected to the memory node that has been holding the ground potential holds a remanent polarization Pr (D') that is smaller (larger in the absolute value) than Pr (D) at a point D' of FIG. 17. Similarly to the prior art, each ferroelectric capacitor holds memory as the remanent polarization when the power is not supplied, thereby the shadow RAM of this embodiment functions as nonvolatile memory.

In this embodiment, the plate line voltage is driven to the higher voltage (first voltage) and the negative voltage (second voltage). By such plate line voltage control, the remanent polarization of the ferroelectric capacitor holding the positive remanent polarization is made larger than that of the prior art (in which the plate line PL is driven to the power supply voltage and the ground potential), and at the same time, the remanent polarization of the ferroelectric capacitor holding the negative remanent polarization is made smaller than that of the prior art. By the enhancement of the of the positive/negative remanent polarization, the effective capacitance difference between the two ferroelectric capacitors becomes larger and thereby the voltage difference occurring between the memory node pair in the recall operation (in which the plate line PL is driven) is made larger. A larger operation margin in the recall operation can be realized and thereby higher reliability of the shadow RAM can be attained in comparison with the prior art.

Storing operations other than the first storing operation are also possible in this embodiment. In the second storing operation in accordance with the present invention, the nonvolatile memory is realized by raising the plate line voltage from Vcc/2 to the power supply voltage and thereafter dropping the plate line voltage to the negative voltage (second voltage). By such plate line voltage control, a larger voltage difference can be applied to the ferroelectric capacitor that is connected to the memory node holding the power supply voltage in comparison with the prior art (in which the plate line voltage is dropped to the ground potential in the storing operation). Therefore, the second storing operation is effective for the improvement of the reliability of shadow RAM operating under a low power supply voltage.

In the third storing operation in accordance with the present invention, the nonvolatile memory is realized by raising the plate line voltage from Vcc/2 to the first voltage (which is higher than the power supply voltage Vcc) and thereafter dropping the plate line voltage to the ground potential. By such plate line voltage control, a smaller voltage (larger voltage difference) can be applied to the ferroelectric capacitor that is connected to the memory node holding the ground potential in comparison with the prior art (in which the plate line voltage is raised to the power supply voltage in the storing operation). Therefore, the third storing operation is also effective for the improvement of the reliability of shadow RAM operating under a low power supply voltage.

Figure 19:
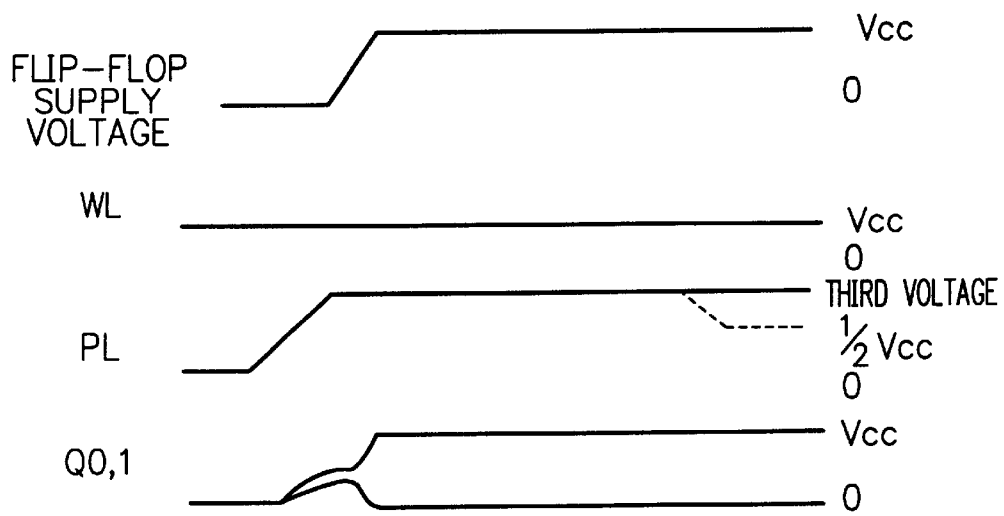
FIG. 19 is a timing chart for explaining the first recall operation which can be employed in the embodiment of the present invention.

In the following, the first recall operation which can be employed in an embodiment of the present invention will be explained referring to a timing chart of FIG. 19. When the power is turned on, the plate line voltage is raised to a third voltage (that is higher than the power supply voltage) while keeping the voltage of the word line WL at a low level (by which the transfer gate transistors (access transistors) M0 and M1 are held in off states) and keeping the flip-flop supply voltage at the ground potential, thereby specific voltages occur to the memory nodes Q0 and Q1 due to capacitive coupling between the plate line PL and the memory nodes by the ferroelectric capacitors F0 and F1. Subsequently, the flip-flop supply voltage is raised so as to amplify and latch the voltage difference between the memory nodes, thereby the data which has been stored in the ferroelectric capacitors as remanent polarization can be recalled as the voltages of the memory nodes Q0 and Q1.

The voltage occurring to each memory node (Q0, Q1) when the plate line voltage is raised to the third voltage is determined by the ratio between the aforementioned capacitive coupling (between the plate line PL and the memory node by the ferroelectric capacitor) and a capacitive coupling of the memory node to other fixed potential. When the plate line PL is driven to a positive voltage, a negative voltage (voltage difference) is applied to the capacitor. At this time, the ferroelectric capacitor holding the positive remanent polarization at the point B' of FIG. 17 functions as a larger capacitance than the ferroelectric capacitor holding the negative remanent polarization at the point D'. That is evident from the steeper slope of the path from the point B' to the point C' on the Q-V plane (shown by an arrow Y3) in comparison with the slope of the path from the point D' to the point C' (shown by an arrow Y4). Therefore, one of the memory nodes Q0 and Q1 that is connected to the ferroelectric capacitor holding the positive remanent polarization has a larger capacitive coupling to the plate line PL (which is driven to the high voltage (third voltage)), and thus the memory node exhibits a higher voltage than the other memory node.

Subsequently, the flip-flop supply voltage is raised and thereby the voltage difference between the memory nodes is amplified. Eventually, the voltage of the memory node that has been at the point B' of FIG. 17 becomes Vcc and the voltage of the memory node that has been at the point D' becomes GND. Consequently, for the memory node that held Vcc before the power shutoff, a ferroelectric capacitor that is connected to the memory node holds the memory at the point B' of FIG. 17, and the memory node will hold Vcc again after the power is turned on again. Similarly, for the memory node that held 0V before the power shutoff, a ferroelectric capacitor that is connected to the memory node holds the memory at the point D' of FIG. 17, and the memory node will hold 0V again after the power is turned on again.

In the first recall operation in accordance with the present invention, the plate line PL is driven to a voltage higher than the power supply voltage in the recall operation and thereby a higher voltage difference is applied to the ferroelectric capacitor in comparison with the prior art (in which the plate line PL is driven to the power supply voltage). Therefore, the voltage difference between the memory node pair can be enhanced in comparison with the prior art.

Figure 20:
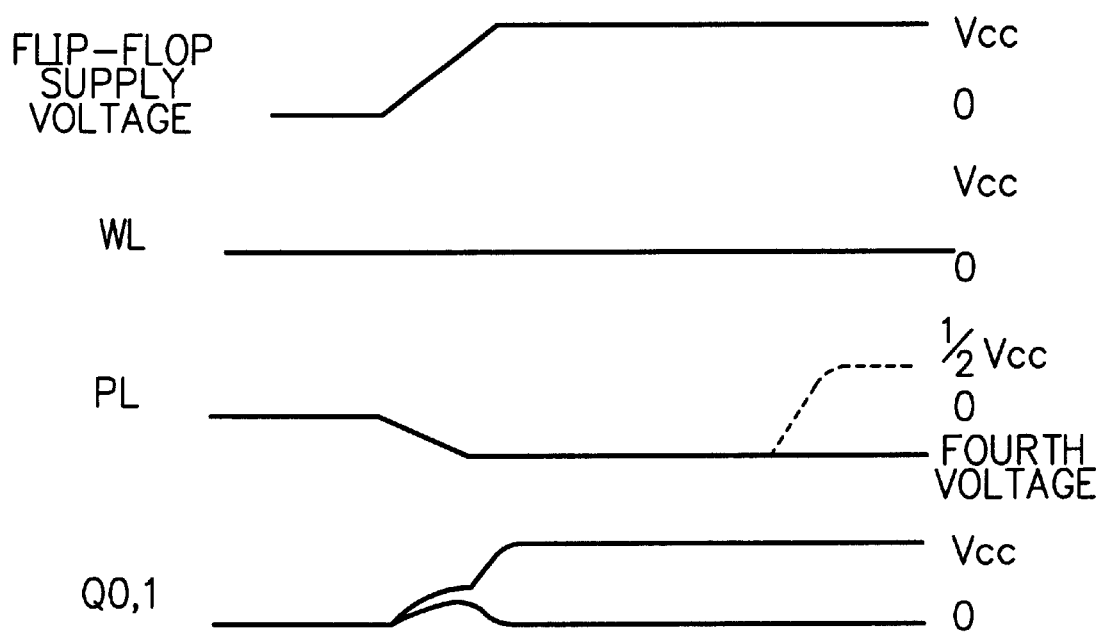
FIG. 20 is a timing chart for explaining the second recall operation which can be employed in the embodiment of the present invention.

Recall operation other than the first recall operation is also possible. In the second recall operation in accordance with the present invention, high reliability is realized by driving the plate line PL to a negative voltage. The second recall operation, which is carried out when the power is turned on, will be explained referring to a timing chart of FIG. 20. In the second recall operation, when the power is turned on, the plate line voltage is dropped to a negative voltage (fourth voltage) and (almost concurrently) the flip-flop supply voltage is raised, while keeping the word line WL at a low level (by which the transfer gates are held in off states). Incidentally, the dropping of the plate line voltage to the fourth voltage can be done either before or after the raising of the flip-flop supply voltage. By such control, specific voltages occur to the memory nodes Q0 and Q1 due to capacitive coupling between the plate line PL and the memory nodes by the ferroelectric capacitors F0 and F1. Finally, the voltages which occurred to the memory nodes are amplified and latched by the flip-flop 3, thereby the data which has been stored in the ferroelectric capacitors F0 and F1 as remanent polarization can be recalled as the voltages of the memory nodes Q0 and Q1.

As described above, in accordance with the embodiment of the present invention, the voltage control of the plate line PL in the storing operation and the recall operation is changed from that of the conventional shadow RAM, thereby the voltage difference occurring between the memory nodes when the plate line is driven in the recall operation can be made larger and thereby nonvolatile memory operation with higher reliability can be realized in comparison with the prior art. In the prior art, the reliability of the nonvolatile memory is necessitated to deteriorate especially if the power supply voltage decreased due to the miniaturization of the semiconductor integrated circuits. If the power supply voltage decreases and thereby the voltage that can be applied to the ferroelectric capacitors (which is equal to the power supply voltage in the prior art) also decreases, the remanent polarization of the ferroelectric capacitors and the voltage difference occurring between the memory nodes in the recall operation also decrease and thereby the reliability of the nonvolatile memory is necessitated to be deteriorated. On the other hand, in the above embodiment of the present invention, a sufficient voltage can be applied to the ferroelectric capacitors by driving the plate line PL to a higher voltage or a negative voltage even if the power supply voltage decreased. Therefore, the embodiment is capable of efficiently ensuring high reliability while lightening the load of circuit design.

While three storing operations and two recall operations have been explained as storing operations and recall operations in accordance with the embodiment of the present invention, all the operations have a point in common in that the nonvolatile memory is realized by use of the remanent polarization of the ferroelectric capacitors. The point is also in common with the prior art of Japanese Patent Application Laid-Open No.2000-293989. Therefore, it is possible to realize a shadow RAM by any combination of a storing operation and a recall operation from the prior art or the embodiment of the present invention. High reliability under a low power supply voltage can be obtained by combining a storing operation and a recall operation in accordance with the present invention as mentioned above. However, also by combining a storing operation of the present invention and the recall operation of the prior art or by combining the storing operation of the prior art and a recall operation of the present invention, reliability higher than that of the prior art can be obtained.

Incidentally, when a combination of the first storing operation and the first recall operation or a combination of the third storing operation and the first recall operation in accordance with the present invention (using voltages higher than the power supply voltage Vcc) is employed, it is also possible to set the first voltage of the storing operation equal to the third voltage of the recall operation for the simplification of the high voltage generation circuit 5. Similarly, when a combination of the first storing operation and the second recall operation or a combination of the second storing operation and the second recall operation in accordance with the present invention (using negative voltages) is employed, it is also possible to set the second voltage of the storing operation equal to the fourth voltage of the recall operation for the simplification of the negative voltage generation circuit 6.

When a combination of the third storing operation and the first recall operation, a combination of the third storing operation and the recall operation of the prior art, or a combination of the storing operation of the prior art and the first recall operation is employed, there is no need to drive the plate line PL to a negative voltage and thus the negative voltage generation circuit 6 can be omitted. Similarly, when a combination of the second storing operation and the second recall operation, a combination of the second storing operation and the recall operation of the prior art, or a combination of the storing operation of the prior art and the second recall operation is employed, there is no need to drive the plate line PL to a voltage higher than the power supply voltage and thus the high voltage generation circuit 5 can be omitted.

In the above explanation, the plate line voltage is set to Vcc/2 in normal operation states according to the prior art (Japanese Patent Application Laid-Open No.2000-293989). The voltage setting is employed for limiting the voltage applied to each ferroelectric capacitor to Vcc/2 or −Vcc/2 in the normal operation states. Such plate line voltage setting is effective for the reduction of variation of the ferroelectric capacitors with time. However, the variation of the ferroelectric capacitors with time is a phenomenon that is radically irrelevant to the nonvolatile memory endurance characteristics which are improved by the present invention, therefore, the effects of the present invention are not impaired even if the plate line voltage in the normal operation states is set to the ground potential or the power supply voltage.

In the memory cell and the shadow RAM (nonvolatile memory device) according to the present invention, high reliability can be realized only by driving the plate line PL to the higher voltage (first voltage, third voltage) or the negative voltage (second voltage, fourth voltage), using the same memory cell power supply and memory cell power supply voltage Vcc as those of the conventional shadow RAM. Therefore, the memory cells of the present invention can be manufactured by use of ordinary processes and high-density packing and high-speed operation of the memory cells can be realized in the same way as the conventional shadow RAM. Only the plate line driving circuit 4, the high voltage generation circuit 5 and the negative voltage generation circuit 6 are constructed by use of devices of high withstand voltages or devices capable of operating under negative voltages.

As set forth hereinabove, in the memory cell, the nonvolatile memory device and the control method for the memory cell in accordance with the present invention, the high voltage generation circuit 5 and/or the negative voltage generation circuit 6 are added to the conventional shadow RAM and thereby the plate line PL is driven to the voltage higher than the power supply voltage Vcc (first voltage, third voltage) or the negative voltage (second voltage, fourth voltage) in the storing operation and/or the recall operation, thereby the nonvolatile memory endurance reliability can be improved especially when the power supply voltage Vcc is low.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A memory cell comprising:
    a pair of memory nodes for holding a pair of complementary voltages;
    a pair of switching elements for controlling the connection between each memory node and a bit line corresponding to the memory node according to ON/OFF control by a common word line; and
    a pair of ferroelectric capacitors each of which is connected to a plate line and corresponding one of the memory nodes, wherein:
        storing operation of the memory cell is carried out by swinging the voltage of the plate line between a first voltage that is higher than power supply voltage of the memory cell and a second voltage that is lower than the ground potential while keeping the pair of switching elements in off states.

2. A memory cell comprising:
    a pair of memory nodes for holding a pair of complementary voltages;
    a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:
   storing operation of the memory cell is carried out by swinging the voltage of the plate line between power supply voltage of the memory cell and a second voltage that is lower than the ground potential while keeping the pair of switching elements in off states.

3. A memory cell comprising:

a pair of memory nodes for holding a pair of complementary voltages;

a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:
   storing operation of the memory cell is carried out by swinging the voltage of the plate line between a first voltage that is higher than power supply voltage of the memory cell and the ground potential while keeping the pair of switching elements in off states.

4. A memory cell comprising:

a pair of memory nodes for holding a pair of complementary voltages;

a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:
   recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states.

5. A memory cell comprising:

a pair of memory nodes for holding a pair of complementary voltages;

a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:
   recall operation of the memory cell is carried out by driving the plate line to a fourth voltage that is lower than the ground potential and raising supply voltage of the memory cell from the ground potential to the power supply voltage of the memory cell while keeping the pair of switching elements in off states.

6. A memory cell as claimed in claim 1, wherein recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states.

7. A memory cell as claimed in claim 6, wherein the third voltage is set equal to the first voltage.

8. A memory cell as claimed in claim 1, wherein recall operation of the memory cell is carried out by driving the plate line to a fourth voltage that is lower than the ground potential and raising supply voltage of the memory cell from the ground potential to the power supply voltage of the memory cell while keeping the pair of switching elements in off states.

9. A memory cell as claimed in claim 8, wherein the fourth voltage is set equal to the second voltage.

10. A memory cell as claimed in claim 2, wherein recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states.

11. A memory cell as claimed in claim 2, wherein recall operation of the memory cell is carried out by driving the plate line to a fourth voltage that is lower than the ground potential and raising supply voltage of the memory cell from the ground potential to the power supply voltage of the memory cell while keeping the pair of switching elements in off states.

12. A memory cell as claimed in claim 11, wherein the fourth voltage is set equal to the second voltage.

13. A memory cell as claimed in claim 3, wherein recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states.

14. A memory cell as claimed in claim 13, wherein the third voltage is set equal to the first voltage.

15. A memory cell as claimed in claim 3, wherein recall operation of the memory cell is carried out by driving the plate line to a fourth voltage that is lower than the ground potential and raising supply voltage of the memory cell from the ground potential to the power supply voltage of the memory cell while keeping the pair of switching elements in off states.

16. A memory cell as claimed in claim 6, wherein the memory cell includes a pair of logic inversion elements which are connected together in ring connection so that each of the memory nodes will be formed between the output terminal of one logic inversion element and the input terminal of the other logic inversion element.

17. A memory cell as claimed in claim 16, wherein the switching elements are implemented by MOS transistors.

18. A memory cell as claimed in claim 16, wherein the switching elements and the logic inversion elements are implemented by a 6-transistor CMOS flip-flop.

19. A memory cell as claimed in claim 16, wherein the switching elements and the logic inversion elements are implemented by a high-resistance-load 4-transistor flip-flop.

20. A memory cell as claimed in claim 16, wherein the switching elements and the logic inversion elements are implemented by a loadless 4-transistor flip-flop.

21. A memory cell as claimed in claim 8, wherein the memory cell includes a pair of logic inversion elements which are connected together in ring connection so that each of the memory nodes will be formed between the output terminal of one logic inversion element and the input terminal of the other logic inversion element.

22. A memory cell as claimed in claim 21, wherein the switching elements are implemented by MOS transistors.

23. A memory cell as claimed in claim 21, wherein the switching elements and the logic inversion elements are implemented by a 6-transistor CMOS flip-flop.

24. A memory cell as claimed in claim 21, wherein the switching elements and the logic inversion elements are implemented by a high-resistance-load 4-transistor flip-flop.

25. A memory cell as claimed in claim 21, wherein the switching elements and the logic inversion elements are implemented by a loadless 4-transistor flip-flop.

26. A nonvolatile memory device comprising memory cells that are arranged in a matrix, wherein:
the memory cell includes: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes, and
at least storing operation or recall operation of each memory cell is carried out according to operation selected from:
(A) first storing operation in which the voltage of the plate line is swung between a first voltage that is higher than power supply voltage of the memory cell and a second voltage that is lower than the ground potential while keeping the pair of switching elements in off states;
(B) second storing operation in which the voltage of the plate line is swung between the power supply voltage of the memory cell and a second voltage that is lower than the ground potential while keeping the pair of switching elements in off states;
(C) third storing operation in which the voltage of the plate line is swung between a first voltage that is higher than the power supply voltage of the memory cell and the ground potential while keeping the pair of switching elements in off states;
(D) first recall operation in which the plate line is driven to a third voltage that is higher than power supply voltage of the memory cell and thereafter supply voltage of the memory cell is raised from the ground potential to the power supply voltage of the memory cell while keeping the pair of switching elements in off states; and
(E) second recall operation in which the plate line is driven to a fourth voltage that is lower than the ground potential and supply voltage of the memory cell is raised from the ground potential to the power supply voltage of the memory cell while keeping the pair of switching elements in off states.

27. A nonvolatile memory device as claimed in claim 26, wherein all the memory cells are connected to a common plate line.

28. A nonvolatile memory device as claimed in claim 27, further comprising a plate line driving circuit for driving the common plate line.

29. A nonvolatile memory device as claimed in claim 28, further comprising a high voltage generation circuit for generating a voltage higher than the power supply voltage and supplying the high voltage to the plate line driving circuit.

30. A nonvolatile memory device as claimed in claim 28, further comprising a negative voltage generation circuit for generating a negative voltage and supplying the negative voltage to the plate line driving circuit.

31. A nonvolatile memory device as claimed in claim 29, further comprising a negative voltage generation circuit for generating a negative voltage and supplying the negative voltage to the plate line driving circuit.

32. A nonvolatile memory device as claimed in claim 29, wherein:
the memory cells are implemented by devices of normal withstand voltages, and
the plate line driving circuit and the high voltage generation circuit are implemented by devices of high withstand voltages.

33. A nonvolatile memory device as claimed in claim 30, wherein:
the memory cells are implemented by devices of normal withstand voltages, and
the plate line driving circuit and the negative voltage generation circuit are implemented by devices capable of operating under negative voltages.

34. A nonvolatile memory device as claimed in claim 28, wherein the plate line driving circuit raises the voltage of the common plate line from a preset voltage that is between the ground potential and the power supply voltage to the first voltage and thereafter drops the voltage to the second voltage in the storing operation.

35. A nonvolatile memory device as claimed in claim 28, wherein the plate line driving circuit drops the voltage of the common plate line from a preset voltage that is between the ground potential and the power supply voltage to the second voltage and thereafter raises the voltage to the first voltage in the storing operation.

36. A nonvolatile memory device as claimed in claim 28, wherein the plate line driving circuit raises the voltage of the common plate line from a preset voltage that is between the ground potential and the power supply voltage to the power supply voltage and thereafter drops the voltage to the second voltage in the storing operation.

37. A nonvolatile memory device as claimed in claim 28, wherein the plate line driving circuit drops the voltage of the common plate line from a preset voltage that is between the ground potential and the power supply voltage to the second voltage and thereafter raises the voltage to the power supply voltage in the storing operation.

38. A nonvolatile memory device as claimed in claim 28, wherein the plate line driving circuit raises the voltage of the common plate line from a preset voltage that is between the ground potential and the power supply voltage to the first voltage and thereafter drops the voltage to the ground potential in the storing operation.

39. A nonvolatile memory device as claimed in claim 28, wherein the plate line driving circuit drops the voltage of the common plate line from a preset voltage that is between the ground potential and the power supply voltage to the ground potential and thereafter raises the voltage to the first voltage in the storing operation.

40. A nonvolatile memory device as claimed in claim 28, wherein the plate line driving circuit raises the voltage of the common plate line to the third voltage before the supply voltage of the memory cells is raised in the recall operation.

41. A nonvolatile memory device as claimed in claim 28, wherein the plate line driving circuit drops the voltage of the common plate line to the fourth voltage almost concurrently with the raising of the supply voltage of the memory cells in the recall operation.

42. A control method for a memory cell that comprises: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:

storing operation of the memory cell is carried out by swinging the voltage of the plate line between a first voltage that is higher than power supply voltage of the memory cell and a second voltage that is lower than the ground potential while keeping the pair of switching elements in off states.

43. A control method for a memory cell that comprises: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:

storing operation of the memory cell is carried out by swinging the voltage of the plate line between power supply voltage of the memory cell and a second voltage that is lower than the ground potential while keeping the pair of switching elements in off states.

44. A control method for a memory cell that comprises: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:

storing operation of the memory cell is carried out by swinging the voltage of the plate line between a first voltage that is higher than power supply voltage of the memory cell and the ground potential while keeping the pair of switching elements in off states.

45. A control method for a memory cell that comprises: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:

recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states.

46. A control method for a memory cell that comprises: a pair of memory nodes for holding a pair of complementary voltages; a pair of switching elements for controlling the connection between each memory node and a bit line corresponding to the memory node according to ON/OFF control by a common word line; and a pair of ferroelectric capacitors each of which is connected to a plate line and corresponding one of the memory nodes, wherein:

recall operation of the memory cell is carried out by driving the plate line to a fourth voltage that is lower than the ground potential and raising supply voltage of the memory cell from the ground potential to the power supply voltage of the memory cell while keeping the pair of switching elements in off states.

47. A control method as claimed in claim 42, wherein recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states.

48. A control method as claimed in claim 47, wherein the third voltage is set equal to the first voltage.

49. A control method as claimed in claim 42, wherein recall operation of the memory cell is carried out by driving the plate line to a fourth voltage that is lower than the ground potential and raising supply voltage of the memory cell from the ground potential to the power supply voltage of the memory cell while keeping the pair of switching elements in off states.

50. A control method as claimed in claim 49, wherein the fourth voltage is set equal to the second voltage.

51. A control method as claimed in claim 43, wherein recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states.

52. A control method as claimed in claim 43, wherein recall operation of the memory cell is carried out by driving the plate line to a fourth voltage that is lower than the ground potential and raising supply voltage of the memory cell from the ground potential to the power supply voltage of the memory cell while keeping the pair of switching elements in off states.

53. A control method as claimed in claim 52, wherein the fourth voltage is set equal to the second voltage.

54. A control method as claimed in claim 44, wherein recall operation of the memory cell is carried out by driving the plate line to a third voltage that is higher than power supply voltage of the memory cell and thereafter raising supply voltage of the memory cell from the ground potential to the power supply voltage of the memory cell while keeping the pair of switching elements in off states.

55. A control method as claimed in claim 54, wherein the third voltage is set equal to the first voltage.

56. A control method as claimed in claim 44, wherein recall operation of the memory cell is carried out by driving the plate line to a fourth voltage that is lower than the ground potential and raising supply voltage of the memory cell from the ground potential to the power supply voltage of the memory cell while keeping the pair of switching elements in off states.

* * * * *